United States Patent [19]

Pipes et al.

[11] 4,234,958

[45] Nov. 18, 1980

[54] RADIO SYNCHRONIZED TIME-KEEPING APPARATUS AND METHOD

[75] Inventors: William F. Pipes, Smyrna; Roy V. Millsap, Roswell; Richard W. McClure; Harrison G. Hooper, both of Atlanta, all of Ga.

[73] Assignee: Lathem Time Recorder Co., Inc., Atlanta, Ga.

[21] Appl. No.: 807,011

[22] Filed: Jun. 16, 1977

[51] Int. Cl.³ .............................................. H03K 1/17

[52] U.S. Cl. .................................... 375/107; 375/118; 368/47

[58] Field of Search .................. 178/69.1; 179/15 BS; 325/58, 321, 325, 363; 331/172; 343/225; 340/146.1 D, 147 SY; 58/35 W; 375/106, 107, 118; 370/100

[56] References Cited

U.S. PATENT DOCUMENTS

| | | | |
|---|---|---|---|
| 3,684,964 | 8/1972 | Bright et al. ................... | 340/147 SY |
| 4,051,663 | 10/1977 | Chihatca et al. ................... | 58/35 W |

*Primary Examiner*—Benedict V. Safourek

*Attorney, Agent, or Firm*—Newton, Hopkins & Ormsby

[57] ABSTRACT

A synchronizer comprised of a combination of integrated circuits including logic gates, latches and counters designed to interface with a master time controller to provide a means of linking the accuracy of the time controller to a time reference provided by the WWV signal broadcast by the National Bureau of Standards.

24 Claims, 12 Drawing Figures

RADIO SYNCHRONIZED TIME-KEEPING APPARATUS AND METHOD

CROSS REFERENCE TO RELATED APPLICATION

This application is related to U.S. Ser. No. 721,110, now abandoned, entitled "Master Time Controller", which was filed on Sept. 7, 1976 in the name of William F. Pipes, et al. the inventors of the subject invention, which invention is also assigned to the assignee of the present invention.

BACKGROUND OF THE INVENTION

1. Field of the Invention

This invention relates to horological systems comprised of a plurality of slave clocks driven from a master time controller and is more particularly concerned with a method and apparatus for improving the time keeping accuracy of the master time controller.

2. Description of the Prior Art

The above cross referenced master time controller, hereinafter referred to as "system", discloses a clock system which is operated selectively from a 50 Hz. or 60 Hz line current or a piezoelectric crystal oscillator circuit. A frequency, whether generated by line current or from the oscillator, is subdivided to provide sub-multiples of the frequency in the form of spaced timing pulses from which pulse trains are generated to drive respective stepper motors of a plurality of slave clocks. The stepper motors and thus the clocks are intermittently advanced a predetermined discrete amount in response to each pulse coupled thereto. Therefore, stepper motor advancement in any given time period is directly related to the number of timing pulses applied in that time. In normal operation of the system, these timing pulses occur at a rate of 24 Hz. which cause the stepper motors to advance at a rate of one revolution per minute, which in turn is translated to a time indication by the clocks. Any inaccuracy in the timing pulse rate will be directly reflected in the time indication. Over long periods of time, a small constant inaccuracy will accumulate into a large error of time indication. Normally, the inaccuracy of 50 Hz. or 60 Hz. line current a selective time base for timing pulses is averaged out over long periods of time. However, short inaccuracies may be relatively large and unacceptable for certain purposes. The inaccuracies of the piezoelectric crystal oscillator, the other selective time base for the timing pulses, will be very small but will nevertheless accumulate over long periods of time.

Accordingly, the system's circuitry is such that the timing pulse rate can be increased to 32 Hz. or decreased to 16 Hz. for correctional purposes. When the timing pulse rate is 32 Hz., the system is said to be in an advanced mode, causing the clocks to gain one second each three seconds. When the timing pulse rate is 16 Hz., the system is said to be in a retarded mode, causing the clocks to loose one second each three seconds. The advanced mode and the retarded mode can be initiated and stopped manually thereby providing a means of correcting errors in the time indication; however, the overall accuracy of the system will be dependent on the accuracy and frequency of manual adjustment.

As to the concept of time synchronization and automatic time adjustment of a clock, the patent to R. Marti, U.S. Pat. No. 3,530,663 discloses an automatic timing setting device for an electronic clock in which correction signals are obtained by a continuous pulse-by-pulse comparison of the oscillating frequency of the clock or a division thereof with the time "ticks" of a broadcasted reference frequency. If the time ticks for any reason are not received, i.e. sensed, the error will be carried forward.

The applicants are also aware of the following additional United States patents relating generally to the present invention: U.S. Pat. Nos. 2,595,431, 3,128,465, 3,217,258, 3,590,573, 3,648,173, 3,685,278, 3,697,689, 3,748,846, 3,861,134, 3,881,310, 3,920,918, 3,921,076, 3,940,558.

SUMMARY OF THE INVENTION

Briefly, the subject invention is directed to a synchronizer which is electronically interfaced with the system as shown and described in the above cross-referenced related application to automatically correct unacceptable timing errors. The timing pulses generated by the system are fed to the subject invention hereinafter referred to as the "synchronizer" wherein they are divided in frequency and applied to a counter. The counter, which repeatedly counts zero through nine, advances one count for each 144 timing pulses which under normal conditions requires six seconds due to the timing pulse rate of 24 Hz. The count level of the counter is sampled at one minute intervals in accordance with a digital pulse generated coincident with the 1000 Hz. minute tone burst broadcast by the National Bureau of Standards WWV. The digital pulse, being highly accurate relative to time is generated from a tone decode circuit which is coupled to a radio receiver tuned to WWV.

Circuitry in the synchronizer is arranged such that when power is initially applied, the counter is held reset to count zero until the currents of the first digital pulse at which time the counter is released and allowed to count. From this time on, the counter repeatedly counts through nine and back to count zero when the digital pulses occur. If the system timing pulse rate is slow, the counter will be at a count nine, for example, when the digital pulse derived from WWV occurs. If the timing pulse rate continues to be slow, the counter will eventually be at the count eight when the digital pulse occurs and unless corrective action is taken, the counter will continue to regress to a lower count level when the digital pulse occurs. If on the other hand the system timing pulse rate is fast, the counter will eventually progress to count one when the digital pulse occurs and unless corrective action is taken, the counter will continue to progress to a higher count when the digital pulse occurs.

The count level of the counter is accordingly decoded such that if the counter is at count zero or nine when the digital pulse occurs, no corrective action is taken, thereby allowing up to a ± six second difference between the system time indication and WWV. If the counter is at a count 1, 2, 3 or 4 when the digital pulse occurs, a fast condition will be decoded. A decoder in turn starts an 18 second timer and sets a six second retard circuit. Setting the retard circuit forces the system into its retarded mode of operation, thereby reducing the timing pulse rate to 16 Hz. At the end of the 18 second timer interval, six second retard circuit will be reset and the system will return to normal operation, but the time indication will have been corrected by six seconds and the counter of the synchronizer will have been returned one count closer to zero when the next digital pulse occurs. Until the counter returns to count nine or zero at which time no action is taken, the above process will be repeated.

If the counter is at count 5, 6, 7 or 8, when the digital pulse occurs, a slow condition will be decoded. The decoder will in turn start the 18 second timer and a six second advance circuit will be set. Setting this circuit forces the system into its advanced mode of operation, increasing the timing pulse rate to 32 Hz. At the end of this 18 second timer period the six second advance circuit will be reset and the system will return to normal operation, but the time indication again will be corrected by six seconds and the counter will have been moved one count closer to zero when the following digital pulse occurs. Again until the counter returns to count nine or zero, the above process will be repeated.

The synchronizer is also provided with a time correction inhibit circuit which inhibits starting the 18 second timer and setting the six second retard or an advance circuit when the system itself is already in an advanced or retarded mode of operation. This action is necessary to prevent attempted time corrections when the system is manually forced into a retarded or advanced mode as may be the case when changing from Daylight Savings Time or Standard Time.

The synchronizer additionally provides the optional feature of inhibiting the pulse train to the stepper motors until the occurrence of the first digital pulse after power is turned on. This allows the second hand of the slaved clocks to be set and started from zero seconds in synchronization with WWV.

DESCRIPTION OF THE PREFERRED EMBODIMENT

Prior to disclosing a detailed description of the subject invention, reference will first be made to the master time controller, hereinafter referred to as the system, which forms the operational environment of the subject invention and with which it is interfaced to provide a means of enhancing the time keeping accuracy of the system by linking it to a standard time base provided by the WWV signal broadcast by the National Bureau of Standards.

MASTER TIME CONTROLLER

Logic Diagram

Figure 1A:
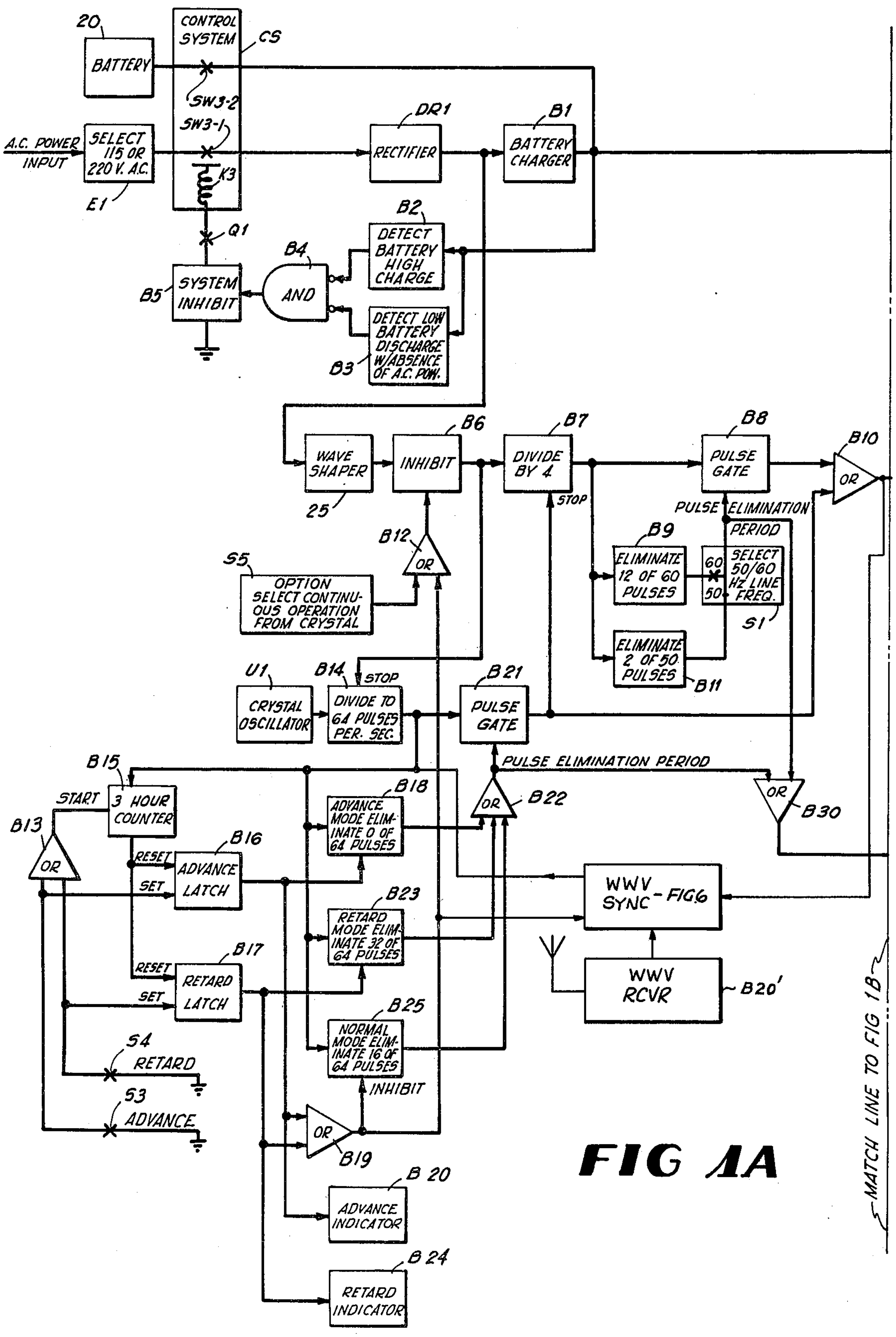
FIG. 1A is a logic or function diagram of a portion of the system including the synchronizer of the present invention.
Figure 1B:
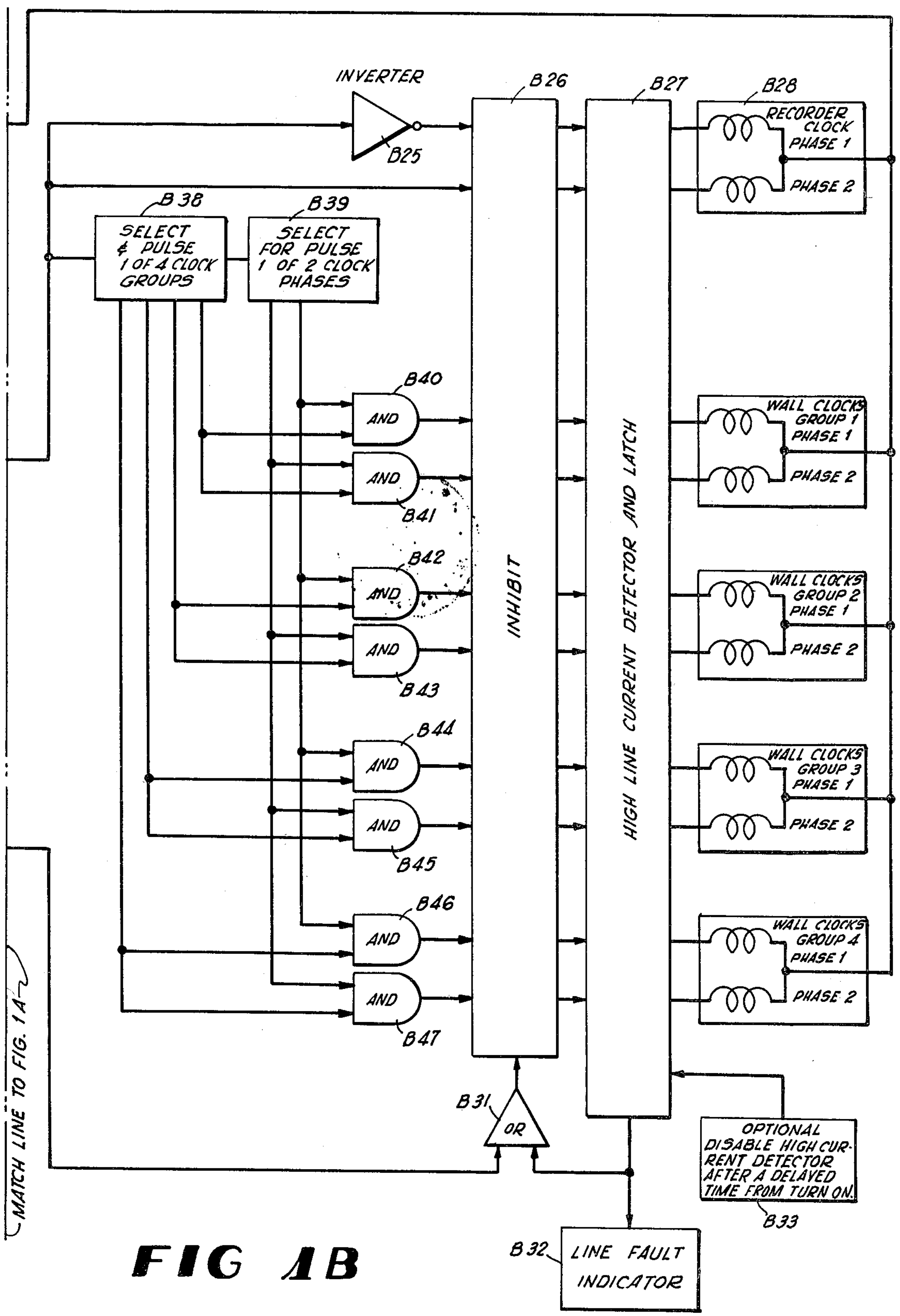
FIG. 1B is the remainder of the logic or function diagram contained in FIG. 1A.

Referring first to the logic or function diagram contained in FIGS. 1A and 1B, the system exclusive of the synchronizer according to the present invention is illustrated as normally powered from an a.c. power input which is either 115 or 220 volts a.c. and which may be either 50 Hz. or 60 Hz. Such a source of power can be totally eliminated if desired, and the line current can be used solely to recharge the battery. The function or logic block E 1 indicates the source of current. Thence, in the illustrated circuitry this a.c. signal is rectified by full wave rectifier DR 1 and fed to a battery charger B 1 for maintaining the battery 20 in a charged condition. A control system logic CS, which includes the switches Sw 2-1 and SW 3-2 as well as the coil of relay K 3, determines when the system is to shut down, by disengaging the system from both the a.c. sources of power and the battery 20. This shut down is based upon low voltage at the battery 20 and the lack of current from the a.c. source.

Current from the battery 20 is indicated as passing through a function logic B 2 which has means to detect a high charge and also to a function logic B 3 which has means to detect a low voltage, with the absence of a.c. power. In the event that an excessively high voltage is detected by logic B 2 in excess of, for example, 26 volts, a logic gate indicated as AND gate B 4 signals the system inhibitor logic B 5 to shut down the system. In like fashion, if a low voltage, below for example, 20 volts, is detected, with the absence of a.c. power, AND gate B 4 will signal the system inhibitor logic B 5 to shut down the system.

When the system is operating from line voltage, the 50 Hz. signal is rectified to 100 Hz. since the rectifier DR 1 is a full wave rectifier. In like fashion, positive going pulses of 120 Hz. are fed, if a 60 Hz. line current is employed. In either event, the rectified a.c. signal is fed to a wave shaper logic in the form of a quad NAND gate 25, and, thence, through function logic B 6, which serves as a switch to inhibit or pass the a.c. rectified signal.

In normal operations, the signal from the wave shaper logic 25 is fed, through inhibit logic B 6 to a divide logic B 7 where the 100 Hz. or 120 Hz. signal is divided by four, to generate a 25 Hz. or 30 Hz. signal (as the case may be) which is then fed to a pulse gate logic B 8. At the pulse gate logic B 8, the last portion of the signal for each second, whether it be 25 Hz. or 30 Hz. is reduced to 24 Hz.

When operating on a line frequency of 60 Hz., select switch S 1 is to be manually positioned to permit a signal of 30 Hz. from logic B 7, through the eliminate logic B 9, to be fed to the pulse gate logic B 8. This eliminates 6 Hz. (12 pulses per second) from the 30 Hz. signal so that only a 24 Hz. signal is fed to OR gate logic B 10.

When operating on a line frequency of 50 Hz., the select switch S1 is to be manually thrown so that a signal, from divide logic B 7, via eliminate logic B 11, eliminates 1 Hz. (2 pulses per second) from the 25 Hz. signal to obtain 24 Hz. which is fed to OR gate logic B 10. Therefore, regardless of whether 50 Hz. or 60 Hz.

line current is employed, a 24 Hz. clock pulse signal is fed to OR gate B 10 from logic B 6.

The operation of the inhibit logic B 6 is controlled by an OR gate logic B 12. The purpose of the inhibit logic is to prevent signals from the a.c. source from being transmitted, when signals are fed from the oscillator source. Hence, a signal, either from the crystal oscillator select switch S 5 or from the OR gate logic B 12, will cause the 100 Hz. signal or the 120 Hz. signal (as the case may be) to be stopped or arrested at the inhibit logic B 6. The select switch S 5 is manually operable. The OR gate logic B 12 becomes operative when either an advance switch S 3 or a retard switch S 4 is momentarily closed.

When either the retard switch S 4 or the advance switch S 3 is closed, a signal is fed through an OR gate logic B 13, to start a 3-hour counter B 15. Counter B 15 receives a 32 Hz. (64 pulse) subdivided low frequency signal from a crystal controlled oscillator U 1 (generating a high frequency signal) the signal being sub-divided at logic B 14 to the 32 Hz. The counter B 15 causes the advance latch logic B 16 or the retard latch logic B 17 to be latched for three hours.

When the advance switch S 3 is closed (so as to order the advance of the clocks by one hour) advance latch logic B 16 enables the advance mode logic B 18 to signal, via OR gate logic 22, the pulse gate logic B 14 to feed the entire 32 Hz. signal from logic B 14 to OR gate logic B 10. Thus, the frequency fed to the clocks is increased by $\frac{1}{3}$ from 24 Hz. to 32 Hz. The advance latch logic B 16 also signals, through OR gate logic B 19 and B 12, that the inhibit logic B 6 should pass no signal. This signal (from advance latch logic B 16) is also fed to an advance indicator logic B 20 so that a visual indication of the fact that the clocks are advancing is given over the three hour period which is involved.

The depressing of retard switch S 4 signals that the clocks should be set back by one hour by causing the feeding of a signal, via retard latch logic B 17, to enable the retard mode logic B 23. The retard mode logic B 23 signals the pulse gate B 21 to inhibit 16 of the 32 cycles and thus pass only 16 Hz. for the period of three hours. Thus, the frequency fed to the clocks is reduced by $\frac{1}{3}$. Retard indicator B 24 indicates this.

In the normal mode, the 32 Hz. signal from logic B 14 is reduced to 24 Hz. by the normal mode logic B 25 which inhibits the pulse gate B 21 each fourth pulse of the 32 Hz. signal. During the period in which the fourth pulse is being eliminated, power to all clocks is shut down, as will be explained hereinafter. This results in a 25% power savings. No power shut down occurs in the advance mode since all 32 pulses per second are used.

Thus, it is seen that selectively, a signal of 32 Hz. or 24 Hz. or 16 Hz. is fed from the pulse gate logic B 21 to OR gate logic B 10, depending upon whether the advance switch S 3, or no switch or the retard switch S 4 is depressed. Any signal from pulse gate logic B 21 is fed to divide logic B 7 to inhibit the passing of a signal therethrough.

The normal clock pulse of 24 Hz. or the advance clock pulse of 32 Hz. or the retard clock pulse of 16 Hz., as the case may be, is fed from OR gate logic B 10 through an inverter B 25 to phase 1 of the recorder clocks B 28 and without inversion to phase 2 of these recorder clocks B 28. Both signals are fed through an inhibit logic B 26 and a high line current detect and latch logic b 27.

The function of the inhibit logic B 26 is to disconnect the recorder clocks and wall clocks from current during a pulse elimination period. The pulse elimination period is prescribed by either the OR gate logic B 22 or one of the eliminate logics B 9 and B 11, whichever is supplying a signal.

When the crystal oscillator U 1 supplies clock pulses, these pulses from OR gate B 22 are fed OR gates B 30 and B 31, to actuate the inhibit logic B 26. When, however, a.c. power is being supplied, the inhibit signal from logic B 9 or B 11, as the case may be, is supplied via OR gate logic B 30 and B 31, for actuating the inhibit logic B 26.

In operation, the chopping of the last 12 pulses of a 60 pulse signal at pulse gate B 8 is controlled by logic B 9, during the last one-fifth portion of each second. Hence during that last one-fifth second, the signal from logic B 9 will actuate inhibit logic B 26 to block all incoming current to the wall clocks and recorder clocks.

When the system is in the normal mode or retard mode, the crystal oscillator U 1 supplies the clock pulses, which are chopped to 32 pulses per second, the chopping occurring in the last one-half second of each one second period. Hence during that latter one-half second, retard logic B 23 or normal logic B 25, causes the inhibit logic B 26 to block incoming current to recorder clocks and wall clocks.

The momentary detection of any line fault, such as when any one of the clocks is connected up backwards, will cause a current to be generated by the high line current detect and latch logic B 27 which, then latches in the "on" position to supply current via OR gate logic B 31, to cause the inhibit logic B 26 to be actuated and a line fault indicator B 32 to be actuated, i.e., lighted. If desired, a delay may be introduced into logic B 27 by logic B 33.

The wall clocks, namely groups 1, 2, 3 and 4, are pulsed sequentially at separate increments of each second by the clock pulses from OR gate logic B 10. This is accomplished by a counting arrangement comprising a first select and pulse logic B 38 and a second select and pulse logic B 39 to which the 24 Hz. (or 32 Hz. or 16 Hz.) clock pulses are fed. Within the parameter of a one second time lapse the first select and pulse logic B 38 sends out discrete but time spaced pulses to AND gate logic B 40 and B 41, then to AND gate logic B 42 and B 43, then to AND gate logic B 44 and B 45, and then to AND gate logic B 46 and B 47. The select and pulse logic B 39 sequentially pulses AND gate logics B 40, B 42, B 44 and B 46 and then AND gate logics B 42, B 43, B 45 and B 47 the arrangement being such that discrete clock pulses are fed in successively to phase 1 of wall clock group 1, then phase 1 of group 2, then phase 1 of group 3 and then phase 1 of group 4 during the first one half second, followed by pulses successively to phase 2 of these groups.

Wiring Diagram

Referring now to the wiring diagram of FIGS. 2A–2D, the notation T 1 denotes a transformer, the primary of which carries out the E 1 logic. Transformer T1 may selectively be connected to 220 volts a.c. current or 115 volts a.c. current, as desired. When using 220 volts, the terminals 2 and 3 of transformer T 1 are shunted together and the leads from the 220 volt source are connected to terminals 1 and 4. When 115 volts is employed, one lead from this source is connected to both terminals 1 and 2 while the second lead from this source is connected to both terminals 3 and 4.

The current from the secondary of transformer T 1 is fed, via wires 8 and 9, to a diode bridge DR 1 which provides for full wave rectification. The negative side of the diode bridge DR 1 is grounded at ground G, while the positive side feeds through conductor 10 and through a normally open terminal of a single throw Sw 3-1 of relay K 3, to a thyrister, namely to the anode of a silicon controlled rectifier Q 4. If there is a 50 Hz. line current, a signal of 100 Hz. is generated and if 60 Hz. line current is used a signal of 120 Hz. is generated.

Figure 2A:
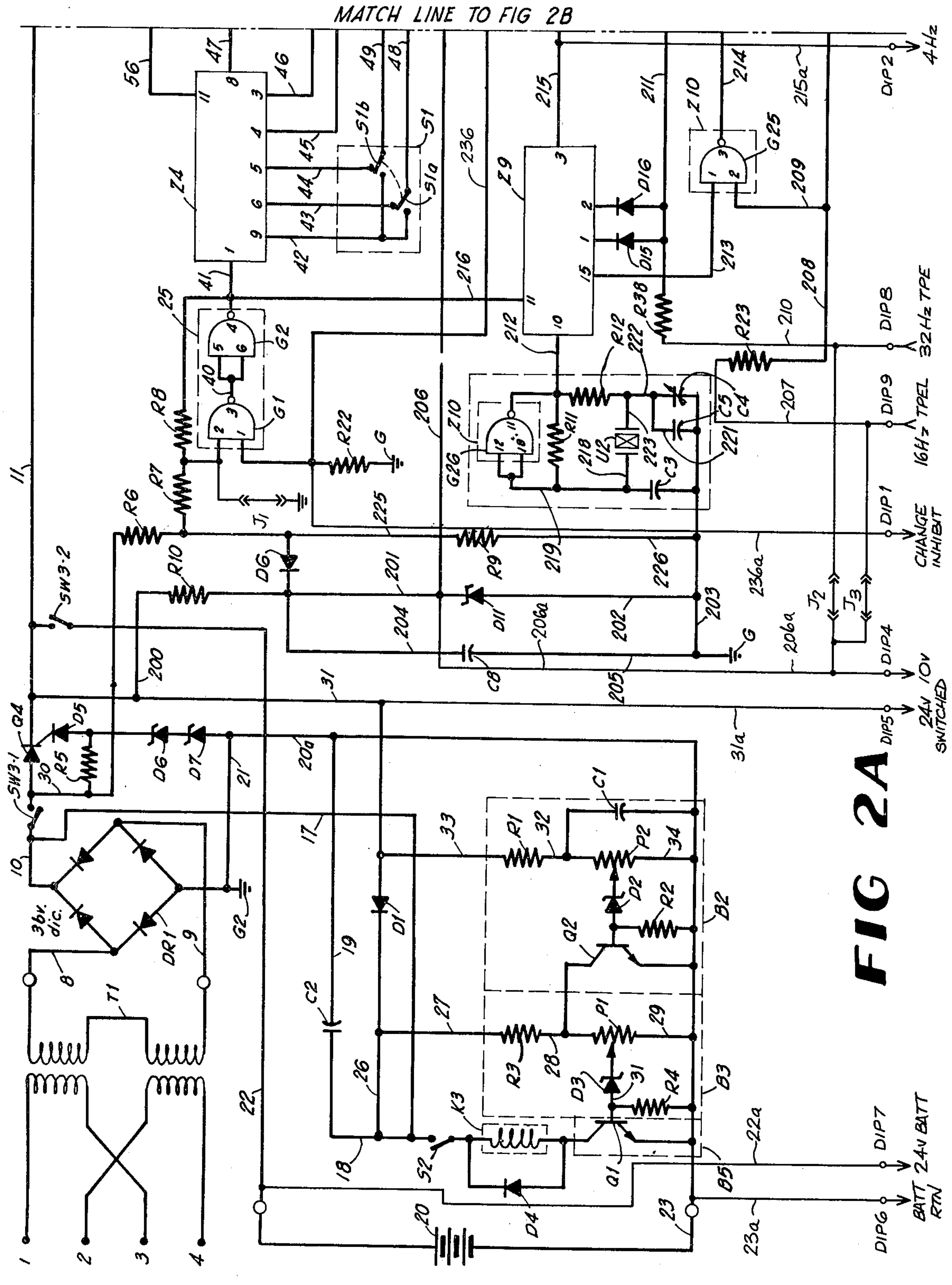
FIG. 2A is a detailed electrical wiring diagram of the system including interface connections for the synchronizer of the present invention.
Figure 2B:
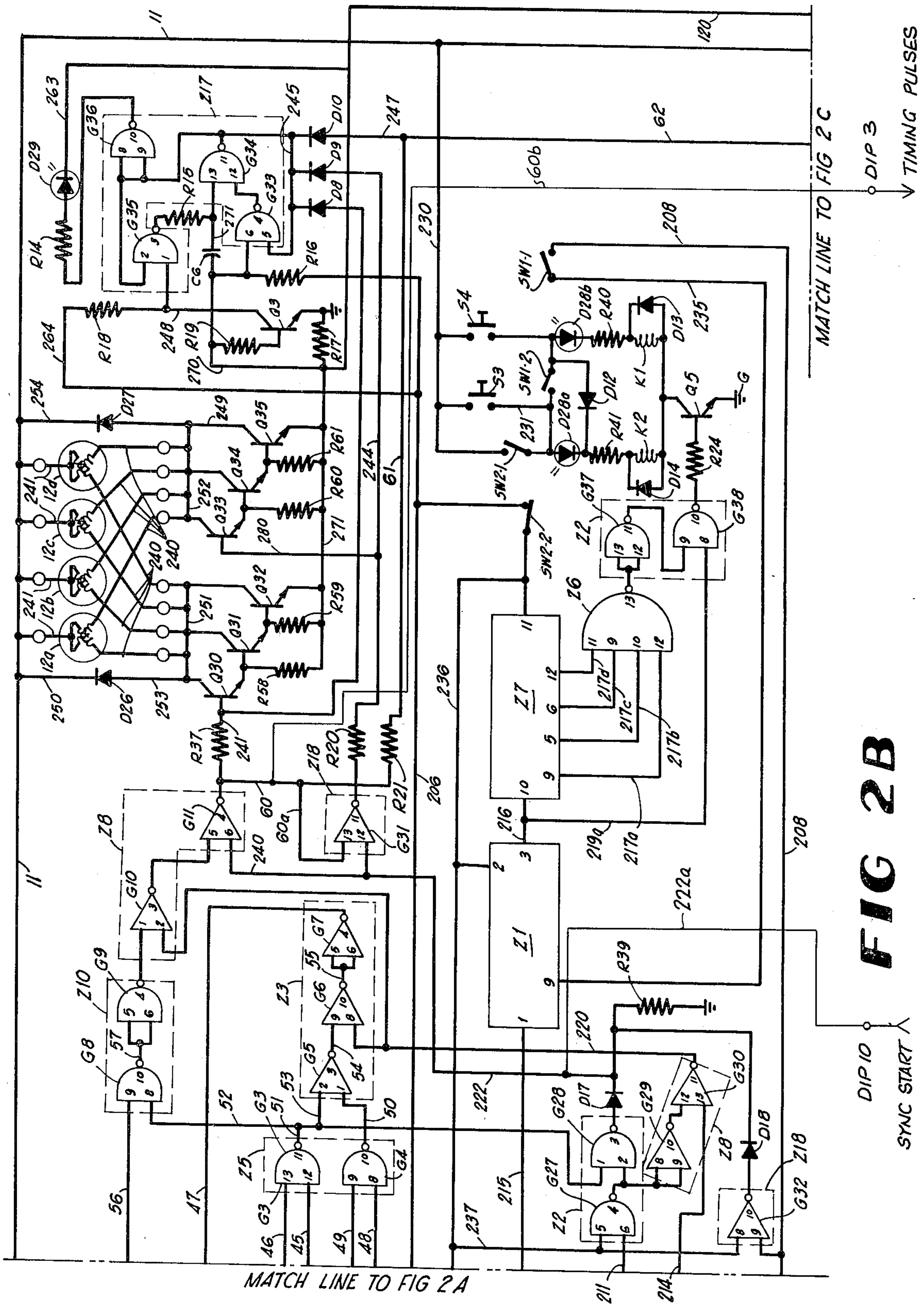
FIGS. 2B, 2C and 2D are continuations of the wiring diagram depicted in FIG. 2A.
Figure 2C:
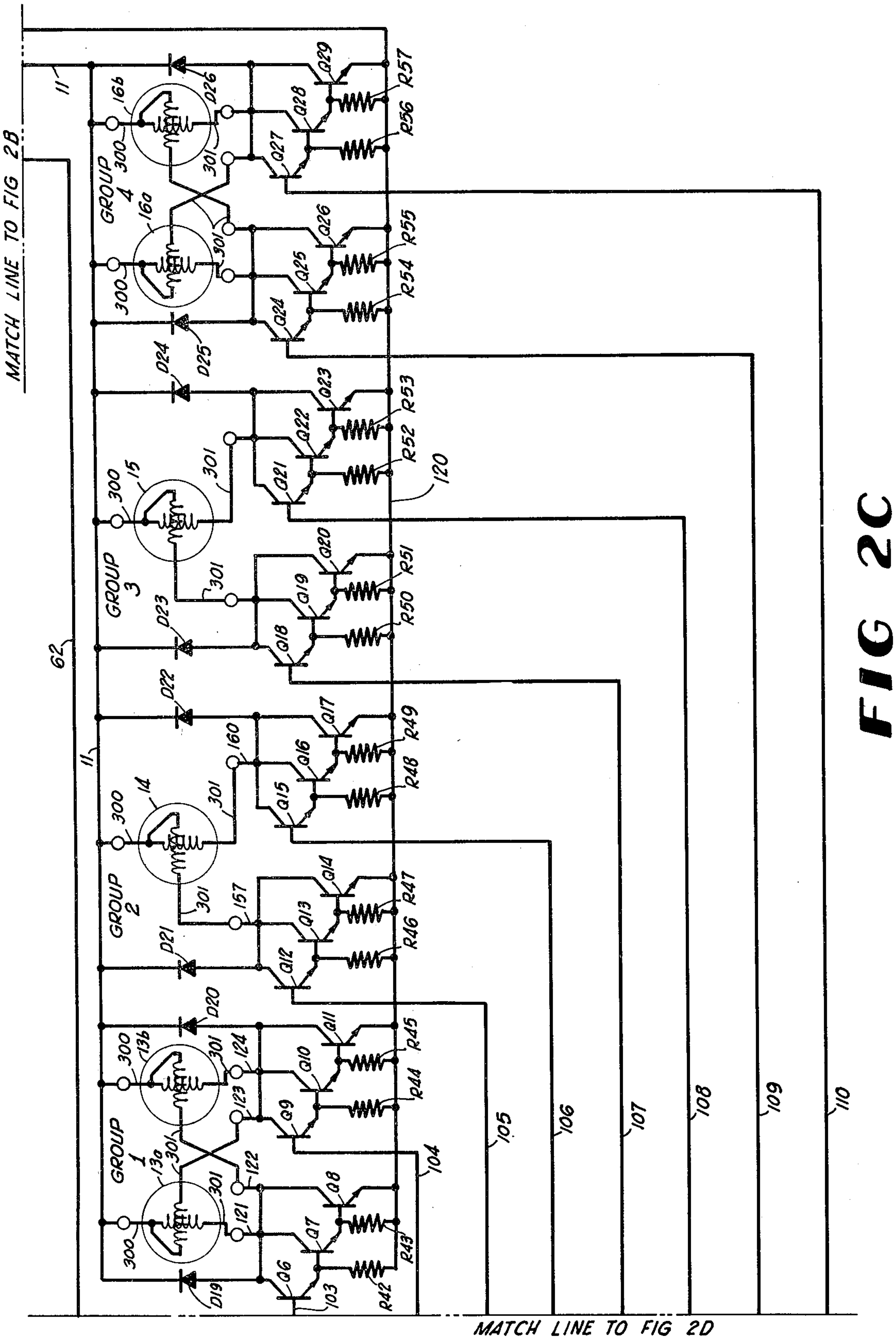

Positive bus 11, seen in FIGS. 2B and 2C, leads from the cathode of rectifier Q 4 to one side of all recorder clock systems, namely clocks 12*a*, 12*b*, 12*c* and 12*d* and all the group 1, 2, 3 and 4 wall clocks, namely clocks 13*a*, 13*b*, 14, 15, 16*a* and 16*b*. It will be understood that the recorder clocks 12*a*, 12*b*, 12*c* and 12*d* are illustrative of numerous recorder clocks which can be driven, utilizing the system. In like fashion, the time clocks or wall clocks 12*a*, 13*b*, 14, 15, 16*a* and 16*b* are illustrative of numerous time clocks which can be connected in the system. When referred to collectively, the recording clocks and the wall clocks or time clocks will be referred to as "clocks". Each of these clocks includes a stepping motor, the pair of coils thereof being disposed 180° out of phase with each other. Each positive going pulse, fed to either coil of the motor will advance the wall clocks by one half second. The recorder motors, however, require 24 positive pulses per second.

It will be understood that switch Sw 3-1 is normally in a position to connect wire 10 to wire 17 which leads to on-off switch S 2. Hence, no current is supplied to the hot wire 11, unless the coil of relay K 3 is energized, to thereby throw the switch Sw 3-1. The purpose of relay K 3 is to assure that the battery 20 is at a proper voltage and to provide for the shut down of the system in the event that it is not. The normal voltage of battery 20 is 24 volts d.c.; however, the voltage may vary from 20 volts to 26 volts without the system becoming inhibited. Thus, relay K 3 forms a system control CS which assures the supply of current if the voltage is proper.

With the on-off switch S 2 in its "off" position, current from rectifier DR 1 will pass, via wire 17 through switch S 2 and wire 18 to one side of capacitor C 2, the other side of which is grounded via wires 19, 20 and 21.

The positive side of battery 20 is connected by wire 22 and normally open switch Sw 3-2 or relay K 3 to the hot wire or bus 11. The negative side of battery 20 is connected by wire 20, 23 and 21 to ground G. Thus, current for the charging of battery 20 is supplied from wire 11, via switch Sw 3-2, when relay K 3 is energized and provided the SCR Q 4 is conducting.

The on-off switch S 2 when on, is connected in series with the coil of relay K 3 and is in series in the main circuit of an NPN transistor Q 1, the coil K 3 being connected to the collector of transistor Q 1 and the ground wire 23 being connected to the emitter of transistor Q 1. The arm of a potentiometer P 1 is connected to the cathode of a zener diode D 3 and the anode thereof to the base of transistor Q 1, via wire 31. The wire 31, in turn, is connected through resistor R 4 to the ground wire 23. The resistance element of potentiometer P 1 which functions to detect low battery discharge (logic B3) is disposed in series with resistor R 3 across wire 18 to ground, in that wires 26 and 27 connect one side of resistor R 3 to wire 18 and wire 28 connects the two resistors together while wire 29 connects the resistance element of potentiometer to ground wire 23. The zener diode D 3 and the potentiometer P 1 form a low voltage control, the arm of the potentiometer P 1 being adjustable so as to alter the low voltage limit which, as pointed out above, is normally 20 volts.

When switch S 2 is thrown to the "on" position and, assuming that the line current has charged the capacitor C 2 through switch Sw 3-1, and wires 17, 18, 19, 20 and 21, the capacitor C 2 will impose a sufficient potential on the base of transistor Q 1 to permit current to flow through the main circuit to energize the coil of relay K 3. Thereafter, a hold down circuit via switch S 2, via wires 18, 26 and 31 and diode D 1 maintains the coil of relay K 3 engaged.

A diode D 4 is disposed across the coil of relay K 3 so as to reduce high frequency noise. Once the relay K 3 has been energized, switches Sw 3-1 and Sw 3-2 are closed. Thus, 36 volt pulsating a.c. current is supplied through the hot wire 10 and the switch Sw 3-1 to wire 30. Resistor R 5 is in series with diode D 5 from wire 30 to the gate of the silicon control rectifier Q 4.

Zener diodes D 6 and D 7, which are disposed in series from ground to the anode of diode D 5, assures that the base of silicon control rectifier Q 4 will not conduct when the battery is charged above 25 volt d.c. Thus, when current is supplied from transformer T 1, the silicon control rectifier Q 4 is turned on, so as to supply current to hot wire 11.

Wire 31 leads from hot wire 11 through a diode D 1 to wire 26 and, when the silicon control rectifier Q 4 is "on", supplies current through on-off switch S 2 to the coil of relay K 3 and supplies sufficient potential, under normal circumstances, through resistor R 3 and potentiometer P 1 to the base of transistor Q 1 so as to maintain the transistor Q 1 in a turned on condition. Also, the capacitor C 2 is thus maintained in a charged condition.

The high voltage level for the charging of battery 20 (logic B 2) is controlled by potentiometer P 2 and the transistor Q 2. When a high voltage, such as more than about 26 volts is attained by battery 20, the transistor Q 2 is turned on, which will drop out the relay K 3. For accomplishing this detect battery high charge logic B 2, the collector of transistor Q 2 is connected to wire 28 and the emitter thereof is connected to ground wire 23. Thus, when the transistor Q 2 is turned on, potentiometer P 1 is essentially shunted, thereby providing close to a zero potential for the base of transistor Q 1. This, in turn, turns off the transistor Q 1 to interrupt the main current flowing in the coil of relay K 3.

The resistance element of potentiometer P 2 is connected, in series with resistor R 1, via wire 32. In turn, resistor R 1 is connected through wire 33 and wire 31 to hot wire 11. The other side of the resistance element of potentiometer P 2 is connected, via wire 34, to ground wire 23. Thus, the 36 volt potential of hot wire 11 will pass through the resistors R 1 and the resistance element of potentiometer P 2 to ground. A zener diode D 2, disposed between the arm of potentiometer P 2 and the base of transistor Q 2 at wire 35, regulates the current to the base of transistor Q 2. A resistor R 2 from wire 35 to ground wire 23 establishes the appropriate potential for the base of the transistor Q 2. Capacitor C 1 which is across the resistance element of potentiometer P 2 prevents oscillation of the current in resistor R 2 due to the pulsating nature of the current in hot wire 11.

As pointed out above, if the current supplied from wire 11 via wire 21 to recharge the battery is more than 26 volts, the detect battery high charge logic B 2 will function in that current passing through the zener diode D 2 from the potentiometer P 2 will be sufficient to trigger the transistor Q 2, thereby shunting potentiometer P 1 which, in turn, will function as a system inhibit (logic B 5) and shut down transistor Q 1, thereby dropping out the relay K 3. Thus the system will shut down in the event that an overload of current is received through the diode bridge DR 1 or as a result of the overcharging of battery 20.

Wire 30 leads through a resistor R 6 and a resistor R 7 to pin 2 of a NAND gate G 1 of a quad 2-input NAND gate chip Z 5 (CD 4011). The other pin 1 of the NAND gate G 1 is connected through resistor 22 to ground G. The inverted signal from NAND gate G 1 is fed through wire 40 to pins 5 and 6 of NAND gate Z 5, namely of Schmitt trigger and wave squarer G 2. The inverted signal from pin 4 of Schmitt trigger G 2 is fed via wire 41, to pin 1 a BCD counter Z 4. The function of the gates G 1 and G 2 is to serve as a wave shaper (logic Z 5) which limits the high voltage to approximately 10 volts and separates the signal into discrete positive going pulses of either 100 Hz. or 120 Hz. as the case may be.

Clock Pulse Generation

The BCD counter Z 4 is a CD 4024 chip and wires 42, 43, 44, 45 and 46 lead from pins 9, 6, 5, 4 and 3, respectively. The BCD counter Z 4 has a reset pin 6 to which a wire 47 is connected, the counter is caused to reset each time it counts 100 pulses or 120 pulses fed from wire 41. In other words, BCD counter Z 4 is reset each second, when utilizing either 50 Hz. or 60 Hz. line current. For selecting when the counter Z4 is reset, i.e., whether or not the system is operating on 50 Hz. or 60 Hz. line voltage, there is a double pole double throw switch S1 (logic S 1) having throw arms S 1*a* and S 1*b*. The wires 42 and 43 lead to the terminals of switch S 1*a*, and the wires 42 and 44 lead to the terminals of switch S 1*b*. The arm of switch S 1*a* is connected to wire 48, and the arm of switch S 1*b* is connected to wire 49. Thus, when the switch S 1 is thrown to the 60 Hz. position, wire 43 is connected via switch S 1*a*, to wire 48 and wire 44 is connected via switch S 1*b* to wire 49. On the other hand, when the switch S 1 is thrown to its 50 Hz. position, the wire 42 is connected to both wire 48 and wire 49.

Pin 9 of counter Z 4 counts to four; pin 6 counts to eight; pin 5 counts to sixteen; pin 4 counts to thirty-two; and pin 3 counts to sixty-four.

Wires 45 and 46 lead to pins 12 and 13 of NAND gate G 3, of the NAND gate chip Z 5 seen in FIG. 2B. Wires 48 and 49 lead respectively to pins 8 and 9 of NAND gate G 4 of chip Z 5. Wire 50, which leads from the output pin 10 of NAND gate G 4, connects to pin 1 of a NOR gate G 5 of on gate chip Z 3, chip Z 3 is a quad NOR gate (CD 4001). Also, the output from NAND gate G 3 leads through wire 51, wire 52 and wire 53 to pin 2 of the NOR gate G 5. The output of the NOR gate G 5, i.e. from pin 3, is fed by wire 54 to NOR gate G 6. The output from pin 10 of NOR gate G 6 leads to pins 5 and 6 of NOR gate G 7, through wire 55. The output of NOR gate G 7 feeds from pin 4 thereof through wire 47 so that when current is supplied through wire 47, the BCD counter Z 4 is reset.

Pin 11 of BCD counter Z 4 is connected via wire 56 to pin 9 of a NAND gate G 8, of NAND gate chip Z 10, seen in FIG. 2B. Pin 11 of counter Z 4 counts one-fourth the total pulses. Thus, it performs the divide by 4 logic B 7. The wire 52 is connected to the other pin, namely pin 8 of NAND gate G 8. The output through pin 10 of NAND gate G 8 is fed via wire 57 to pins 5 and 6 to a NAND gate G 9 of chip Z 10, the gate G 9 functions as an inverter, so that the output through pin 4 of gate G 9 is fed along wires 58 to pin 1 of a NOR gate G 10 of NOR gate chip Z 8.

Returning to the counter Z 4, 32 pulses are signaled from pin 4 of that counter Z 4 along wire 45 and sixty-four pulses are fed along wire 46 from pin 3, both pulses being fed to the NAND gate G 3 which is high during the pulse train of ninety-six pulses, and then goes low to interrupt current via wire 52 to pin 8 of NAND gate G 8 to inhibit the last four pulses of a 100 Hz. cycle.

It will be remembered that pin 11 of the BCD counter Z 4 divides by 4 to deliver one-fourth the pulse. Hence, either 25 or 30 cycles are fed from pin 11 along wire 56 to the NAND gate G 8 depending on the live current frequency. Since the last four of the 100 Hz. signal is inhibited, NAND gate G 3 will interrupt 1 Hz. out of each 25 Hz. pulses (logic B 11) or the last six pulses of 30 Hz. pulses (logic B 9) fed into the NAND gate G 8. Thus, in either event only 24 Hz. signals or clock pulses are fed through the inverter G 9 to pin 1 of the NOR gate G 10 of chip Z 8 (CD 4001).

The gates G 3 and G 4 cooperate to form the 100 Hz. or 120 Hz. one second reset for counter Z 4. When the NAND gate G 3 goes low after the first 96 pulses, gate G 4 goes high and continues the count by 16 pulses signaled from pin 5 of counter Z 4 plus 8 pulses signaled from pin 6 thereof, or only four pulses signaled from pin 9, depending upon the position of switch S 1. Thus, a total of 120 pulses or 100 pulses (as the case may be) are counted and signaled by both NAND gates G 3 and G 4 and such signals supplied from one gate or the other to NOR gate G 5. When both gates G 3 and G 4 go low, a reset pulse from pin 3 of gate G 5 is fed via wire 54 and NOR gates G 6 and inverter G 8 of chip Z 3, via wire 47 causing the counter Z 4 to be reset.

Therefore, the time interval for reset of counter Z 4 is always intended to be one second, and during that one second time interval or time cycle the clock pulse of 24 Hz. is always intended to be fed from gate G 8 for pulsing the clocks.

Wall Clock Pulses

From the gate G 10 the 24 Hz. clock pulses are fed to the NOR gate G 11 and thence through wire 60 and resistor R 21 via wire 61 and wire 62 to be available for the actuation of the wall clocks 13*a*, 13*b*, 14, 15, 16*a*, 16*b*, seen in FIG. 2C.

Figure 2D:
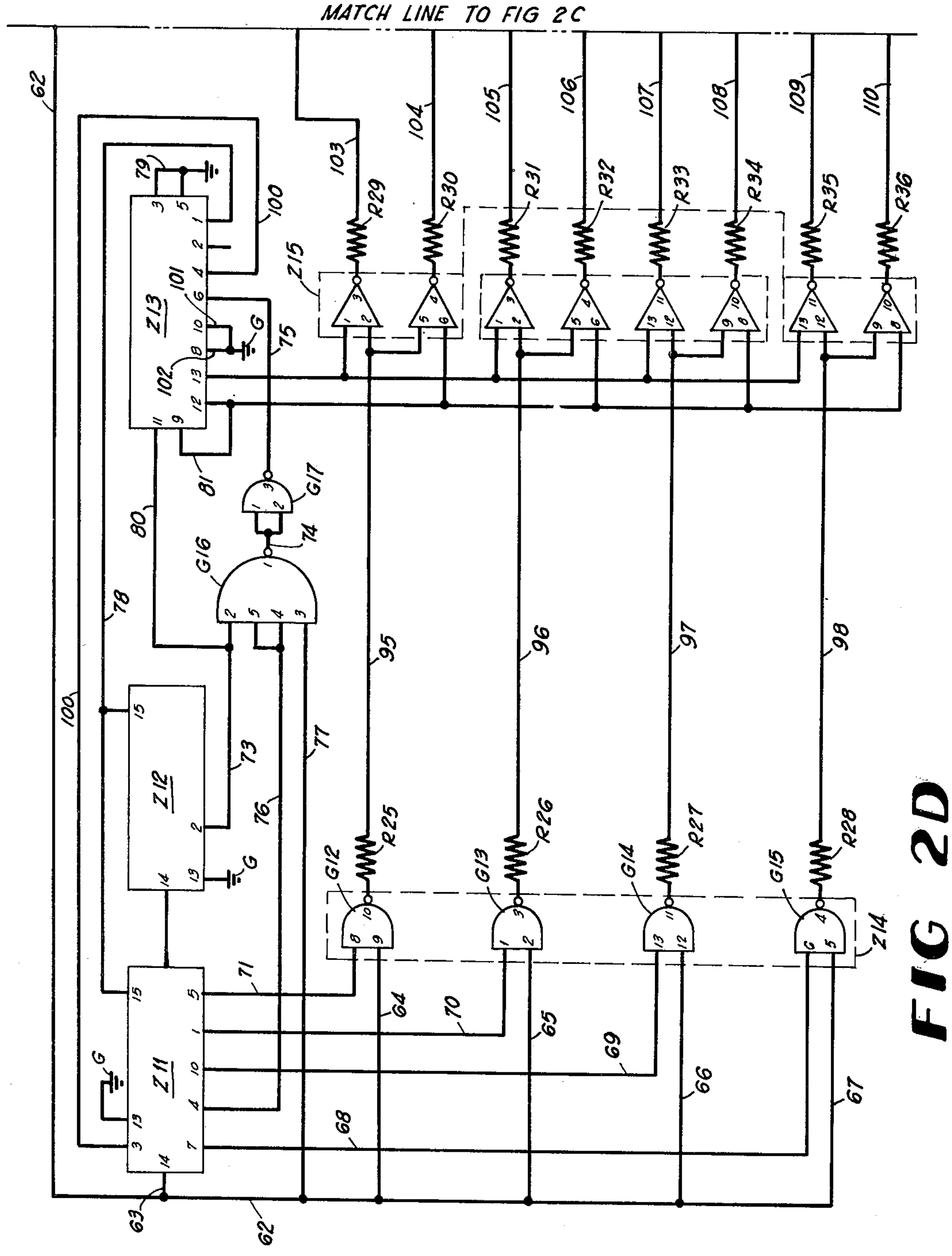

As seen in FIG. 2D, wire 62 leads to pin 14 of decade counter Z 11 (CD 4017) via wire 63. Wire 62 is also connected via wire 64 to pin 9 of NAND gate G 12 (CD 4011), and to pin 2 of NAND gate G13 of chip Z 14. Through wire 66, wire 62 is connected to pin 2 of NAND gate G 14 of chip Z 14. Wire 62 also leads through wire 67 to pin 5 of NAND gate G 15 of chip Z 14. Pin 7 of the decade counter Z 11 is connected through wire 68 to pin 6 of the NAND gate G 15. Pin 10 of the decade counter Z 11 is connected via wire 69 to the pin 13 of NAND gate G 14. Furthermore, pin 1 of the decade counter Z 11 is connected through wire 70 to pin 1 of the NAND gate G 13, while pin 5 of counter Z 11 is connected by wire 71 to pin 8 of the NAND gate G 12. Pin 12 of the decade counter Z 11 is connected through wire 72 to pin 14 of a second decade counter Z 12 (CD 4017). Pins 13 of both decade counters Z 11 and Z 12 are grounded to ground G.

Pin 2 of the second decade counter Z 12 is connected via wire 73 to a NAND gate G 16 (CD 4012). The output from pin 1 of the NAND gate G 16 feeds via wire 74 through an inverter G 17 (CD 4001) to wire 75 which leads to pin 6 of a dual flip-flop Z 13 (CD 4013). Pin 4 of the first decade counter Z 11 is connected via wire 76 to pins 4 and 5 of the NAND gate G 16. Wire 62 is connected to the pin 3 of NAND gate G 16 through wire 77. Pin 15 of both counters Z 11 and Z 12 are connected to wire 78 which, in turn, is connected to pin 1 of the dual flip-flop Z 13. Pins 3 and 5 of the dual flip-flop Z 13 are grounded through wire 79. Pin 11 of flip-flop Z 13 is connected via wire 80 to wire 73, and pins 9 and 12 of flip-flop Z 13 are connected via wires 81, 82 and wire 83 to pin 6 of NOR gate G 18, and via wire 84 to pins 6 of NOR gate 20. In like fashion, wire 82 is connected via wire 85 to pin 8 of NOR gate G 22 and via wire 86 to pin 8 of NOR gate G 24. Pin 13 of the flip-flop Z 13 is connected via wire 90 and wire 91 to pin 1 of NOR gate G 17. Wire 90 is also connected via wire 92 to pin 1 of NOR gate G 19. Furthermore, wire 90 is connected via wire 93 to pin 13 of NOR gate G 21 and via wire 94 to pin 13 of NOR gate G 23. Gates G 17, 18, 23 and 24 are in NOR gate chip Z 15 (CD 4001) gates G 19, 20, 21 and 22 are in NOR gate chip Z 16 (CD 4001).

The output of NAND gate G 12 from pin 10 thereof is fed through a resistor R 25 and wire 95 to pin 2 of NOR gate G 17 and pin 5 of NOR gate G 18. The output from pin 3 of NAND gate G 13 is fed through resistor R 26 and wire 96 to pin 2 of NOR gate G 19 and pin 5 of NOR gate G 20. In like fashion, the output of pin 11 of NAND gate G 14 is fed through resistor R 27 and wire 97 to pin 12 of NOR gate G 21 and pin 9 of NOR gate G 22. The output of NAND gates G 15 is fed via resistor R 28 and wire 98 to pin 12 of OR gate G 23 and to pin 9 of OR gate G 24.

The decade counters Z 11 and Z 12 perform logic B 38 and half of dual flip-flop Z 13 performs logic B 39. The function of counters Z 11 and Z 12 is to count the 24 pulses occurring at wire 63 in a single time interval or cycle of one second, and then to reset and count 24 pulses again. This is accomplished since pins 15 of the decade counters Z 11 and Z 12 will send pulses to the flip-flop Z 13 in order to alter its position back and forth for each twelve pulses. The reset signal is generated through pin 4 of the flip-flop Z 13, the reset signal being fed through wire 100 to pin 3 of the counter Z 11. Pins 8 and 10 of flip-flop Z 13 are grounded through wires 101 and 102 and pins 13 of counter Z 11 and Z 12 are also grounded.

It is now seen that the counter Z 11 counts the first ten pulses received from wire 63 and then passes a signal through wire 72 to the decade counter Z 12, and then the counter Z 12 counts two pulses and passes the signal along wire 73 and wire 80 to cause the flip-flop Z 13 to flip to an opposite position. The two decade counters Z 11 and Z 12 are simultaneously reset by a signal from pin 4 of the flip-flop through wire 100. The decade counter Z 11 then commences to count a second time, counting to ten and then sending a pulse through wire 72 to cause decade counter Z 12 to being counting.

The gates G 16 and G 16*a* are the enabling gates for the purpose of conditioning the flip-flop Z 13 in one state or the other. Each twelve pulses will cause a simultaneous pulse from pin 4 of counter Z 11, and pin 2 of counter Z 12, thus making pins 3, 4, 5 and 2 of NAND gate G 16 high simultaneously so as to pulse pin 6 of the flip-flop Z 13 through inverter G 17. Thus, in each twelve cycles the flip-flop Z 13 is shifted to a different state.

NOR gates G17 through G 24 perform the B 40 through B 47 logics, gates G 17, G 18, G 23 and G 24 being contained in a single chip Z 15 (CD 4001) and gates G 19, G 20, G 21 and G 22 are contained in another single chip Z 16 (CD 4001). From the gate G 17, the signal from pin 3 is fed through a resistor R 29 to wire 103. The gate G 18 feeds a signal from pin 4 through resistor R 30 to wire 104. The gate G 19 feeds a signal from pin 3 through resistor R 31 to wire 105, and gate G 20 feeds a signal through pin 4 and resistor R 32 to wire 106. The gate 21 feeds a signal through pin 11 and through a resistor R 33 to wire 107. The gate G 22 feeds a signal through pin 10 and resistor R 34 to wire 108. The gate G 23 feeds a signal through resistor R 35 to wire 109, and the gate G 24 feeds a signal through pin 10 to resistor R 36 to wire 110.

The signal from wire 103 is connected to the base of a Darlington amplifier consisting of three end-to-end transistors in Q 6, Q 7 and Q 8. The emitter of transistor Q 6 is connected through resistor R 42 to a bus 120. The emitter of transistor Q 7 is connected through resistor R 43 to bus 120, and the emitter of transistor Q 8 is connected directly to the bus 120. The emitter of Q 6 is connected to the base of transistor Q 7; and the emitter of Q 7 is connected to the base of transistor Q 8. The collectors of each of the transistors Q 6, Q 7 and Q 8 are connected to the A phase coil of the group 1 wall clocks, namely, slave wall clock 13*a* via wire 121 and also to the A phase coil of wall slave clock 13*b* via wire 122. The arrangement is such that when a pulse is received along wire 103, the slave wall clocks 13*a* and 13*b* will be advanced by one-half second. In like fashion, the other of B phase coil of the group 1 clocks i.e., clocks 13*a* and 13*b* are pulsed through wire 104. Thus, wire 104 leads to an amplifier consisting of three transistors Q 9, Q 10 and Q 11. The wire 104 leads to the base of transistor Q 9, the emitter of which is connected to the base of transistor Q 10, and also through a resistor R 44 to bus 120. The emitter of transistor Q 10 is connected through resistor R 45 to bus 120, and the emitter of transistor Q 11 is connected directly to bus 120. The collectors of the transistors Q 9, Q 10 and Q 11 each are connected through wire 123 to the other phase of clock 13*a*, and through wire 124 to the B phase coil of clock 13*b*. For preventing any backsurge of current, a diode D 19 is provided across from the emitters of transistors Q 6, Q 7 and Q 8 to bus 11. In like fashion, a diode D 22 is connected to the collectors of transistors Q 9, Q 10 and Q 11 and to the bus 11.

The wires 105 and 106 pulse the A and B phase coils of the group 2 slave wall clocks, namely wall clock 14, the signal from wire 105 being fed through a Darlington amplifier in which the wire 105 is connected to the base of the transistor Q 12 and the signal from wire 106 is connected to the base of transistor Q 15.

The emitter of transistor Q 12 is connected to base of transistor Q 13 and also through resistor 46 to bus 120, the emitter of transistor Q 13 is connected to the base of transistor Q 14 and through resistor 47 to bus 120. All of the collectors of transistors Q 12, Q 13 and Q 14 of one Darlington amplifier are connected to each other and through wire 157 to the A phase coil of the group 2 slave wall clock 14. A diode D 21 across from bus 11 to the collectors of transistors Q 12, Q 13 and Q 14 prevent backsurges of current.

Wire 106 is connected to the other Darlington amplifier in that it is connected to the base of transistor Q 15, the emitter of which is connected to the base of transistor Q 17 and also through resistor 48 to bus 120. The emitter of transistor Q 16 is connected to the base of transistor Q 17 and through resistor R 49 to bus 120. The emitter of transistor Q 17 is connected directly to bus 17. The collectors of all transistors Q 15, Q 16 and Q 17 of the Darlington amplifier are connected via wire 160 to the B phase coil of slave wall clock 14. Also, a diode D 22 is disposed between the bus 11 and these collectors for preventing backsurge of current.

The wires 107 and 108 are for the purpose of pulsing the A and B phases the group 3 clocks, such as clock 15 and wires 109 and 110 are for pulsing the group 4 clocks 16*a* and 16*b*. Transistors Q 18, Q 19, Q 20, Q 21, Q 22 and Q 23 and their resistors R 50, R 51, R 52, R 53 and diodes D 23 and D 24 are connected in the same way as the group 2 transistors Q 12–Q 17 resistors R 46–R 49 and diodes D 21–D 22.

Wires 109 and 110 are for pulsing the group 4 slave wall clocks 16*a* and 16*b*. For this, transistors Q 24, Q 25, Q 26, Q 27, Q 28 and Q 29; resistors R 54, R 55, R 56 and R 57; and diodes D 25 and D 26 are employed in the amplifying array of the group 1 transistors, resistors and diodes.

Figure 4:
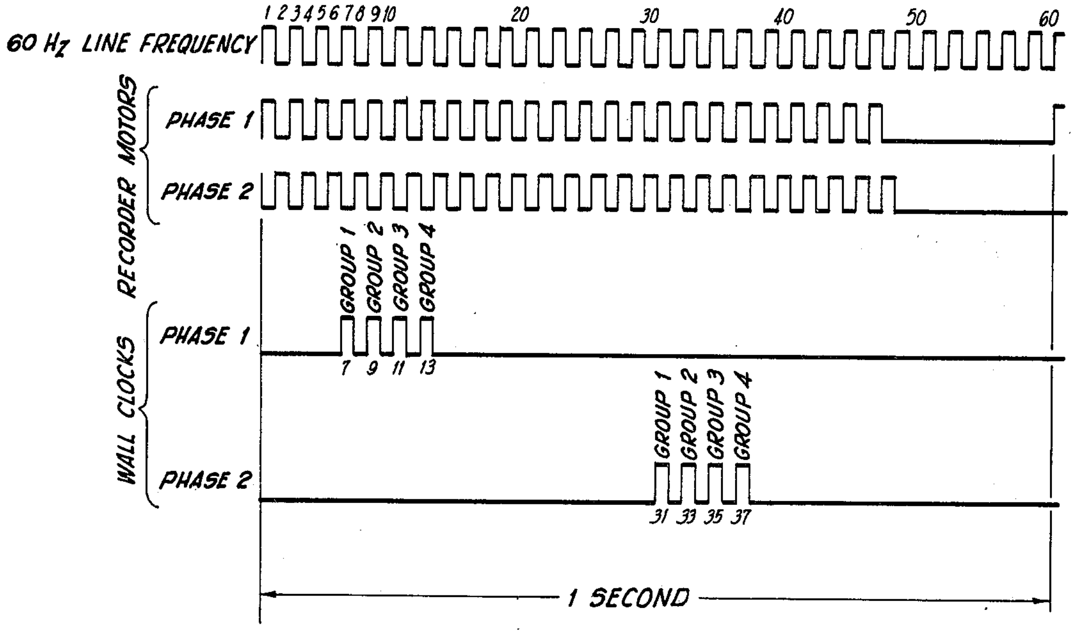
FIG. 4 is a timing diagram of electrical pulses when the system is operating on 60 Hz. line frequency.
Figure 5:
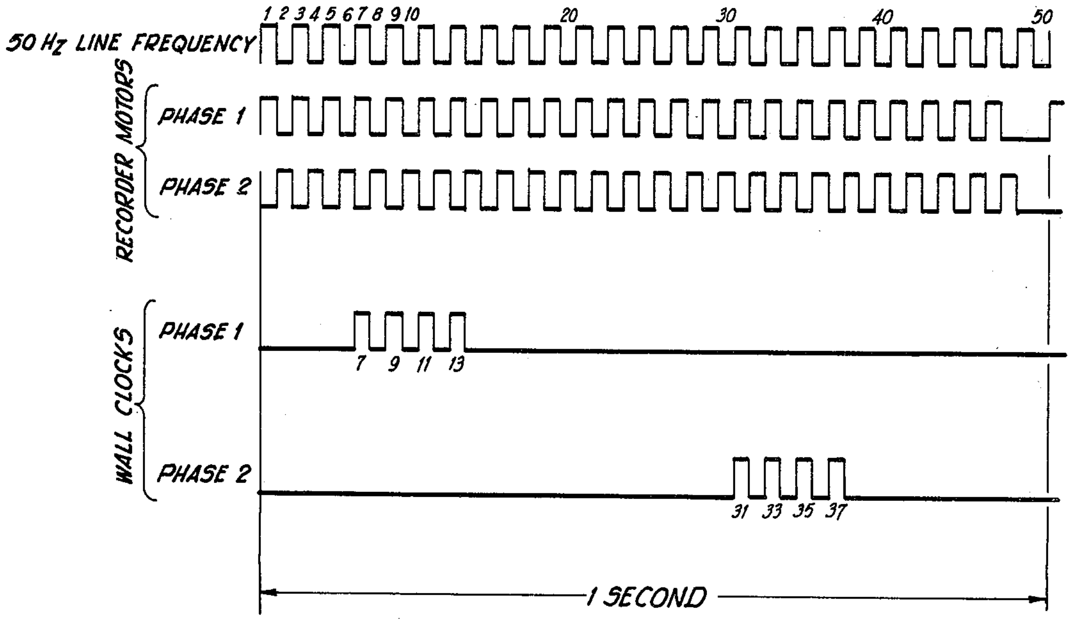
FIG. 5 is a timing diagram of the electrical pulses when the system is operating on 50 Hz. line frequency.

It is now seen that counters Z 11 and Z 12 are reset every one-half second, i.e., after each twelve pulses. In each half cycle of twelve pulses and reset, the counter Z 11 will send out four pulses, one from pin 5, then one from pin 1, then one from pin 10, then one from pin 7 and a total of eight pulses per second. Thus, as illustrated in FIGS. 4 and 5, when the 7th, 9th, 11th and 13th pulse in the first one half second time interval occurs, these pulses are respectively fed to pins 8, 1, 13 and 6 of gates G 12, G 13, G 14 and G 15 and when the 31st, 33rd, 35th and 37th pulse occurs, these pulses are again delivered to these pins.

When both pins 8 and 9 receive a pulse, a pulse is fed along wire 95 and thus actuates either NOR gate G 17 or G 18 (depending upon the condition of flip-flop Z 13). Hence, in the first one-half cycle, the 7th pulse is fed along wire 95 to actuate gate G 17 to pulse the group 1 clocks 13*a* and 13*b* once. In the second one-half cycle, the 31st cycle is fed along wire 95 to actuate gate G 18 to pulse the group 1 slave wall clocks 13*a* and 13*b* a second time.

In like fashion, the 9th and 33rd pulses are fed along wires 96 to cause the gates G 19 and G 20 to pulse first one and then the other coil of the group 2 slave wall clocks, such as slave wall clock 14. The two signals along wire 97 will cause gates G 21 and G 22 to pulse the group 3 slave wall clocks, such as clock 15, with the 11th and 35th pulses; and the two signals along wire 98 will cause gates G 23 and G 24 to pulse the group 4 clocks, such as clocks 16*a* and 16*b*, with the 13th and 37th pulses.

This sequence of pulsing will occur, regardless of whether the line frequency is 50 Hz. or 60 Hz. During the last two cycles of the 50 Hz. operation and during the last twelve cycles of a 60 Hz. operation logics B 26 occur whereby the current is totally inhibited to the clock, due to the fuctioning of NAND gate G 3 (logic B 30) as described above.

Crystal Oscillator Circuitry

Referring now to FIG. 2A, it will be seen that wire 200 is connected to wire 31 and thence to one side of resistor R 10, the other side of which is connected to wire 201 which leads to the cathode of a zener diode D 11, the anode of which is connected through wires 202 and 203 to ground. A capacitor C 8 is disposed across the zener diode D 11 via wires 204 and 205 so as to eliminate the high frequency zener noise. Connected to wire 201 is a wire 206 which supplies a 10 volt d.c. current to drive all of the I.C. circuitry. This driving circuitry, however, is not illustrated. Wires 208 and wire 209, the wire 209 leading to pin 2 of a NAND gate G 25 of a NAND gate chip Z 10 are connected to resistor R 23 which has its other end connected to wire 207 which in turn is connected to connector pin DIP 9 for coupling to the synchronizer as will be described hereinafter.

Wire 211 which is connected to one side of resistor R 38 is connected to the anode of diodes D 15 and D 16, the cathodes of which are connected to pins 1 and 2 of a 14-stage ripple-carry binary counter Z 9 (CD 4020). The counter Z 9 carries out the pulse divide logic B 14, as will be explained hereinafter. Additionally the other side of resistor R 38 is coupled to wire 210 which is adapted to be connected to the synchronizer, also to be explained hereinafter, through connector pin DIP 8.

A crystal oscillator U 1 which is tuned to a frequency of 65,536 Hz. is connected via wire 212 to pin 10 of the binary counter Z 9. Pin 15 of the binary counter Z 9 is connected via wire 213 to the NAND gate G 25, the output from pin 3 of the NAND gate G 25 being connected to wire 214.

Pin 3 of the binary counter Z 9 is connected to wire 215 which leads to pin 1 of a BCD counter Z 1 (CD 4024). Pin 11 of binary counter Z 9 is connected through wire 216 to the output of the Schmitt trigger and wave squarer, i.e. pin 4 of the inverter G 2.

The crystal oscillator U 1 is made up of a frequency determining piezoelectric crystal U 2, one side of which is connected via wire 218 and wire 219 to pins 12 and 18 of a NAND gate which forms an inverter G 26. Pin 11 of the inverter G 26 is connected to wire 220 to wire 212. A capacitor C 3 is disposed between ground G and one side of the crystal U 2, the capacitor C 3 being connected from wire 203 to wire 218. A second capacitor C 5 cooperates with the capacitor C 3 in establishing the resonant frequency for the oscillator U 1. This capacitor C 5 is connected across from ground wire 203 to the other side of crystal U 2 via wires 221, 222 and 223.

In parallel with the capacitor C 5 is a variable capacitor C 4, one side of which is connected to wire 203 and the other side of which is connected to wire 222. Thus, the crystal can be tuned, by movement of the capacitor C 4, so as to trim the frequency to 65,536 Hz. Wire 223 is connected to wire 212. A second resistor R 11 is disposed between wire 219 and wire 212.

Pin 11 of the counter Z 9 is a reset pin and, hence, so long as pulses are being fed from the Schmitt trigger G 2, the binary counter Z 9 is reset continuously. Therefore, none of the pins 1, 2, 3 or 15 is actuated, even though the crystal oscillator U 1 is continuously operating.

Between the resistor R 6 and the resistor R 7 a wire 225 leads to one side of resistor R 9, the other of which is connected via wire 226 to ground wire 203. Wire 225 is also connected to the anode of a diode D 6, the cathode of which is connected to wire 201.

When the line voltage of 50 or 60 Hz. goes out, of course no pulses will be sent along wire 30 and, thence, along wire 216. Therefore, the binary counter Z 9 immediately begins to count. This 14-stage binary counter Z 9 resets itself automatically.

The counter Z 9 feeds a 4 Hz. signal from pin 3, an 8 Hz. signal from pin 2, a 16 Hz. signal from pin 1, and a 32 Hz. signal from pin 15. Wire 211 is connected to pin 6 of a NAND gate G 27 of chip Z 2. The output of pin 4 of NAND gate G 27 is connected to pin 2 of a second NAND gate G 28 and also to both pins 8 and 9 of a NOR gate in chip Z 8 (CD 4001). The NOR gate G 29 functions as an inverter, it having an output from pin 10 which feeds to pin 12 of a NOR gate G 30 also in chip Z 8.

During the period in which the oscillator U 1 is controlling the timing devices, there will be a 4 volt potential on wire 208 and hence pin 2 of NAND gate G 25 will be high. Gate G 25 will also be receiving pulses at the rate of 32 Hz. from pin 15 of the binary counter Z 9. Therefore, the 32 Hz. signal will be fed through wire 214 to pin 13 of the NOR gate G 30. Also, there will be signals from pins 1 and 2 of the binary counter Z 9 which will be fed along wire 211 to pin 6 of NAND gate G 27.

It will be observed that diodes D 15 and D 16 are arranged so that a pulse will be delivered along wire 211, only, when both pin 1 and pin 2 of counter Z 9 are high, simultaneously. Thus, when only one of the pins 1 or 2 is high, the pulse will be fed through the diode back into the other pin since pins 1 and 2 are high together, only one-fourth of the time of each cycle thereby carrying out the B 25 logic. Furthermore, the effect of being high, together, one-fourth of the time causes the elimination of one-fourth of the 32 cycles (16 of the 64 pulses) which are fed through pin 15, since the signal from pins 1 and 2 is fed through the NAND gate G 27 and, thence, through the inverter to pin 12 of the NOR gate G 30. Thus, with one-fourth of the 32 pulses fed along wire 214 being eliminated, only 24 Hz. (48 pulses) are fed from pin 11 of NOR gate G 30. This 24 Hz. signal is fed along wire 220 both to pin 8 of the NOR gate G 6 via wire 221, to pin 2 of the NOR gate G 10.

With a signal being fed from the wire 220 to the NOR gate G 6, and with no signal being received by pin 9 of the NOR gate G 6, a signal is delivered from pin 10 of NOR gate G 6 through the inverter G 7 to wire 47 so as to continuously reset the counter Z 4, and thereby disable the circuitry which normally would drive the clocks. Thus, the 24 Hz. signal is fed through the NOR gate G 10 (logic B 21) and through the NOR gate G 11 (logic B 10) for driving all of the timing devices, namely the wall clocks 13*a* through 16*b* and the recorder clocks 12*a* through 12*d*.

Simultaneously with the delivery of a signal to the inverter G 29, a signal from the NAND gate G 27 is fed to the NAND gate G 28. Since at that time no signal is being received along wire 52, which is connected to pin 1 of the NAND gate G 28, a signal from pin 3 of NAND gate G 28 is fed through the diode D 17 and through wire 222 to pin 12 of the NOR gate G 31 in the NOR gate chip Z 18 and also to pin 6 of the NOR gate G 11. Since pin 6 is high on the NOR gate G 11, the signal from NOR gate G 10 will feed through this NOR gate G 11.

It will be understood that, under normal circumstances, the signal from the crystal oscillator U 1 to drive the clocks will be inhibited, due to the fact that wire 52 makes pin 1 of NAND gate G 28 high.

Where the frequency of the line current is not well controlled or is not periodically adjusted, the crystal oscillator can be used as the sole source of generating a pulsating current. In such instances, the alternating current is used solely to maintain the battery in a charged condition. When the synchronizer according to the subject invention is operative in the system the oscillator is the source used. This is accomplished, for example, by ground pin 2 of NAND gate G 1 by means of a removable jumper J 1 (FIG. 2A) or some type of electrical switch device.

Advance Mode For Daylight Saving

Referring to FIG. 2B, it will be seen that wire 230 leads from the hot wire 11 to one side of a normally open advance switch S 3 and to one side of a normally open retard switch S 4. When switch S 3 is momentarily depressed, all clocks namely the wall clocks and the recorder clocks over the next three hour period are retarded in time by one hour. This is accomplished over a three hour period by increasing the pulse rate or by decreasing the clock pulse rate fed to the clocks by one-third as will be explained hereinafter.

The other side of switch S 3 is connected via wire 231 to the anode of a light emitting diode D 28*a*, the cathode of which is connected to one side of resistor R 41. Light emitting diode D 28*a* performs the function of logic B 22, and lights up during the period in which the clocks are advancing. The other side of resistor R 41 leads to one side of the coil of relay K 2 and to the anode of a diode D 14. The other side of the coil of relay K 2 and the anode of diode D 14 is connected via wire 233 to the collector of an NPN transistor Q 5. The emitter of transistor Q 5 is grounded at G. Relay K 2 performs the function of logic B 16.

The relay K 2 is provided with a normally open switch Sw 2-1. This switch is connected between wire 230 and the wire 231 to form a hold-down circuit for relay K 2, as will be explained hereinafter.

The other side of switch S 4 is connected via wire 234 to the anode of a light emitting diode D 28, the cathode of which is connected to one side of resistor R 40. Diode D 28 performs the function of logic B 24 and lights up during the period in which the clocks are being retarded. The other side of resistor R 40 is connected to one side of the coil of relay K 1 and also to the cathode of a diode D 13. The anode of diode D 13 and the other side of relay K 1 are connected to wire 233, and hence to the collector of transistor Q 5. The relay K 1 is provided with a normally closed switch Sw 1-1 and a normally open switch Sw 1-2. Relay K 1 performs the function of logic B 17. The switch Sw 1-2 is connected between wires 231 and 234. The switch Sw 1-1 is connected between wire 208 and a wire 235 which leads to pin 9 of a BCD counter Z 4 (CD 4024).

When it is intended to advance the clocks by one hour, the advance switch S 3 is depressed, momentarily, so as to make a circuit from the hot wire 11 through wire 230, switch S 3, wire 231, light emitting diode D 27, resistor 41, the coil of relay K 2 to the collector of transistor Q 5, provided the base of transistor Q 5 has been energized. The making of the circuit, momentarily, causes a closing of the hold down switch Sw 2-1. Thus, the coil K 2 is latched in an energized condition.

Relay K 2 is also provided with a second normally open switch Sw 2-2 which is connected between wire 235 and wire 236. It will be remembered that wire 206, to which wire 235 is connected, supplies a 10 volt current and, hence, when relay K 2 is energized and switch Sw 2-2 closed, current will flow through wire 236 and wire 237 to pin 5 of NAND gate G 27. Thus, the signal from NAND gate G 27 to the gates G 28 and G 29 is disrupted, thereby performing logic B 18, by disenabling the feeding of the 4 Hz. pulses from pin 10 of NOR gate G 29 to the NOR gate G 30. Hence, the full 32 Hz. signal (64 pulses per second) received along wire 214 is fed to wire 220 and, thence, along wire 240 to the NOR gates G 11 and NOR gate G 31.

The wire 237 also leads to pin 8 of NOR gate Z 18 which becomes low and which, independent of pin 9, provides no signal. Thus, the NOR gate G 32, a quad 2 input NOR gate chip Z 18, becomes low. The output of gates G 28 and G 32 (logic B 30) both being low enables both gates G 11 and G 31 to pass signals.

The 32 Hz. signal sent along wire 220 thus provides a 32 Hz. signal through pin 6 and pin 4 of the NOR gate G 11 so as to supply 32 Hz. signals to all of the timing devices namely the counter Z 11 and Z 12 of the wall clocks and the recorder clocks.

The 32 Hz. signal continues for a period of three hours so as to supply 8 Hz. for three hours to make up a total of 24 Hz. The device for latching the controller in the advance mode (logic B 16) includes a first BCD counter Z 1 and the second 14-stage binary counter Z 7.

When either the advance mode or the retard mode is operative, the operation continues for three hours, i.e. until the current is interrupted to the base of transistor Q 5. For accomplishing this three hour counting, pin 1 of a seven bit binary counter Z 1 receives the 4 Hz. signal, via wire 215 from pin 3 of counter Z 9. Pin 3 of counter Z 1 is connected via wire 216 to pin 10 of a 14-stage ripple-carrying binary counter Z 7. Pins 9, 5, 6 and 12 of counter Z 7 are respectively connected via wires 217*a*, 217*b*, 217*c* and 217*d* to pins 12, 10, 9 and 11 of a dual 4 input NAND gate Z 6. The output from pin 13 thereof is fed via wire 218 to pins 12 and 13 of a NAND gate G 37 of a quad two input NAND gate chip Z 2. Pin 11 is connected via wire 219 to pin 9 of NAND gate G 38 of chip Z 2, pin 8 of NAND gate G 38 is connected via wire 219*a*, to wire 216. Pins 9, 5, 6 and 12 of counter Z 7 are high, simultaneously with pin 3 of counter Z 1 only once each three hours and this renders pin 9 of gate G 38 high to provide a low at pin 10 of gate G 38 to turn off transistor Q 5. This, in turn, breaks the hold down circuits of relay K 1 and/or K 2, as the case may be.

Retard Mode For Daylight Saving

When the retard switch S 4 is momentarily depressed, a circuit is made through light emitting diode 27 and resistor 40 to energize the coil of relay K 1. The circuit is also made through diode D 12 and resistor 41 to energize the coil of relay K 2. Thus, the switches Sw 1-1 and Sw 1-2 close and also switches Sw 2-1 and Sw 2-2 close. Thereby, a hold down circuit is made through switch Sw 2-1 and Sw 1-2 so as to hold in the coils of both relays K 1 and K 2. With switch Sw 1-1 being closed, the counter Z 1 supplies current to pin 9 of the NOR gate G 32. At the same time, a pulse is fed to pin 2 of NAND gate G 25 of one Hz. Thus, over the period of one-half of the time, the gate G 25 is disabled by the signal and, therefore a signal of only 16 Hz. is fed through the gate and, thence, along wire 214 and NOR gate G 30 so as to supply a 16 Hz. signal along wire 221 for the pulsing of the clocks.

It will be remembered that pin 3 of the binary counter Z 9 feeds a 4 Hz. signal to the clock input, namely pin 1 of the counter Z 1. Pin 9, to which wire 235 is connected, divides by four and hence puts out a 1 Hz. signal. When relay K 1 is energized, the retard logic B 17 is carried out in that switch Sw 1-1 is closed and, hence, a circuit is made to wire 208 and from wire 208 through wire 209 to pin 2 of NAND gate G 25. Due to the 1 Hz. signal, wire 208 is low during one half second and becomes high during the other half second. During the period in which the wire 209 is low and hence pin 2 of the NAND gate G 25 is low, this NAND gate G 25 is disabled. Thus, it carries out logic B 23 and prevents the last one half second of the 32 Hz. signals from passing out of gate G 25 whereby only the first 16 pulses of the 32 Hz. signal is fed through wire 214 to gate G 30 and thence through wire 220 to gate G 6. Gate G 6 has an OR gate function and determines whether you receive a signal from the crystal oscillator or from the line voltage. Thence, the signal is fed through the inverter G 7 so as to disable the counter Z 4, as explained above. From wire 220, the wire 221 leads to NOR gate G 10 and since pin 1 is low, the signal is passed to gate G 11 which, due to the fact that pin 6 is maintained low during the half cycle that the 16 Hz. are transmitted, permits NOR gate G 11 to feed the 16 Hz. to the timing devices or clocks.

Rest Period

As pointed out above, during the later portion of each second of operation, the system is disabled so that no current, whatsoever, is fed to the various timing devices. When operating from the crystal oscillator, U 1, the disabling of the system is accomplished, due to the fact that pins 1 and 2 of the counter Z 9 feed a 4 Hz. signal which when it is high causes pin 4 of gate G 27 to go low and causes pin 3 of the NAND gate G 28 to go high, thereby supplying a high level, via wires 222, to pin 12 of the NOR gate G 31 and pin 6 of the NOR gate G 11. This causes pin 11 of the NOR gate G 31 to go low and pin 4 of gate G 11 to go low, thereby disabling the circuitry leading to all the clocks. When operating from line current, the disabling signal is fed through wire 52 to pin 1 of NAND gate G 28 which is a negative signal causing pin 3 to go high and thereby providing a high signal to pin 12 of NOR gate G 31 and pin 6 of NOR gate G 11, as described above.

Pin 11 of NOR gate G 31 is connected to one side of resistor 20, the other side of which is connected to wire 244. Wire 280 is connected between the base of transistor Q 33 and wire 244. When wire 244 goes to zero potential, inhibit logic B 26 is carried out, the wire 280 disabling the transistor Q 33, thereby disabling transistor Q 34 and Q 35 to shut down the current to one pulse of the clocks 12*a*, 12*b*, 12*c* and 12*d*. Similar action controlled by pin 4 of gate G 11 causes shut down of the remaining phases of clocks 12*a*, 12*b*, 12*c* and 12*d*. Also, since pin 11 of gate G 31, which pulses the wall clock circuitry, is held low, current to all wall clocks is shut down.

The emitters of transistors Q 32 and Q 35 are connected directly to the wire 271 while the emitters of transistors Q 30, Q 31, Q 33 and Q 34 are connected respectively through resistors R 58, R 59, R 60 and R 61 to wire 271. The emitter of transistor Q 31 is connected to the base of transistor Q 32 while the emitter of transistor Q 32 is connected to the base of transistor Q 32. In like fashion, the emitter of transistor Q 33 is connected to the base of transistor Q 34, and the emitter of transistor Q 35 is connected to the base of transistor Q 35. All of the collectors of transistors Q 30, Q 31 and Q 32 are connected to the common wire of bus 251 and all of the collectors of the transitors Q 33, Q 34 and Q 35 are connected to the common wire or bus 252.

Each time the base of transistor Q 30 receives a pulse from the NOR gate G 11, the A phase coils of the slave recorder clocks 12*a*, 12*b*, 12*c* and 12*d* are pulsed so as to advance these clocks by one forty-eighth second. When the signal goes low, however, this signal is fed via wire 60 along wire 60*a* to pin 13 of the NOR gate G 31, so that a pulse is generated through resistor 20 and wire 244 and 280 to the base of transistor Q 33 which, in turn, passes to the base of transistor Q 34 and transistor Q 35, thereby making a main circuit for the bus 252 so that logic B 25 is carried out and the B phase coils of all slave recorder clocks 12*a*, 12*b*, 12*c* and 12*d* are pulsed, advancing the recorder clocks another one forty-eighth second. Thus, for each 24 Hz. cycle of the system, the recorder clocks are advanced by one second.

Hook up wires 250 in FIG. 2B leads from the collector wire 251 of the transistors Q 30, Q 31 and Q 32 to the A phase coils of the recorder clocks 12*a*, 12*b*, 12*c*, and 12*d*. From this wire 251, a wire 253 leads to the anode of diode D 26 and, thence, via wire 250 to wire 11. Hook up wires 249 lead from collector wire 252 of the transistors Q 33, Q 34, and Q 35 to the B stage coils of recorder clocks 12*a*, 12*b*, 12*c* and 12*d*. From the wire 252 a wire 249 leads to the anode of diode D 27, the cathode of which is also connected to wire 11 via wire 254.

Wire 244 connects wire 241, via diode D 8, to bus 245. Wire 246 connects the output of gate G 31 via resistor R 20 and diode D 9 to bus 245 and wire 247 connects wire 61 via diode D 10 to bus 245.

One side of a resistor R 18 is connected to wire 264 and the other side is connected to the wire 248 and thence to pin 1 of NAND gate G 35. The wire 248 is connected to the collector of an NPN transistor Q 3, the emitter of which is connected to ground and also to one side of resistor R 17. The other side of resistor R 17 is connected to wire 120 which leads to the wall clock circuitry seen in FIG. 2D. The other side of the resistor is also connected to wire 271 which is connected to one side of resistors R 48, R 59, R 60 and R 61.

Figure 3:
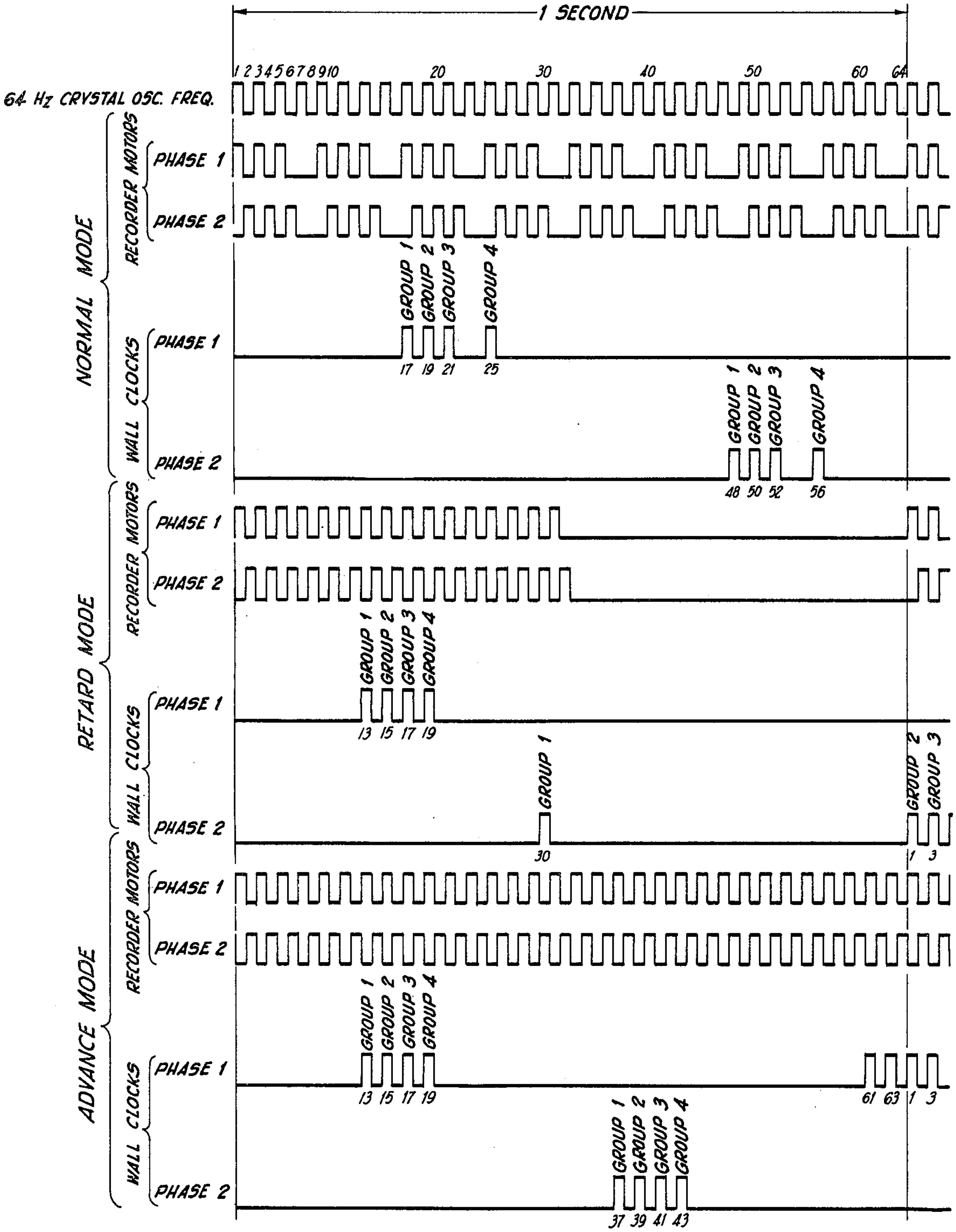
FIG. 3 is a timing diagram of the electrical pulses utilized by the system and depicting the clock pulse pattern in the normal mode, retard mode and advance mode.

It is now seen that since the recorder clock pulls very much more current than a wall clock, the phase 1 coil of all recorder clocks will be pulsed 24 times each second and phase 2 coil of the recorder clocks will be pulsed 24 times each second, while a wall clock will be receiving only two pulses, one for its phase 1 coil and one for its phase 2 coil when the system is in its normal mode, as depicted graphically in FIGS. 4 and 5. In the retard mode, the cycles for the recorder clock is reduced to 16 Hz. and in the advance mode increased to 32 Hz., as shown graphically in FIG. 3.

Improper Hook Up of Clocks or Overload

Referring to the chip Z 17, containing NAND gates G 33, G 34, G 35 and G 36, seen in FIG. 2B, the purpose f this circuitry is to provide a visual signal (logic B 32) in the event that the wires to either the wall clocks or to the recorder clocks are hooked up in the wrong way and to disconnect these clocks (logic B 26) in the event of either a wrong hook up of the wires of the clocks or an overload.

Bus 245 is connected to pin 5 of a NAND gate G 33 of chip Z 17. Pin 6 of NAND gate G 33 is connected, via wire 260, to one side of resistor R 16, the other side of which is connected to wire 206.

It will be remembered that wire 206 supplies a voltage of approximately 10 volts for the driving of all the I.C. circuitry. Since pin 5 of the NAND gate G 33 is low, this causes pin 4 to be high to supply current to pin 12 of NAND gate G 34. Under normal circumstances, the 24 Hz. signal to the recorder clocks and wall clock circuitry is fed via wires 61, 241 and 244 through diodes D 8, D 9, and D 10 to pin 11 of gate G 34 which is high. When any clock draws too much current due to an improper connection or short voltage will develop across current sense resistor R 17 sufficient to turn on transistor Q 3 pulling pin of gate G 35 low. This forces pin 3 of gate G 35 high which, in turn, forces pin 11 of gate G 34 low and latches itself by placing a low on pin 2 of gate G 35. Pin 11 of gate G 34 being low, shorts out the 24 Hz. signals going to the recorder and wall clocks via diodes D 8, D 9 and D 10 as stated above and thus shuts down power to all clocks. It can also be seen that pin 11 of gate G 34 being low, causes pin 8 and 9 of G 36 to be low which in turn causes pin 10 of gate G 36 to be high. A high on pin 10 of gate G 36 forces current through resistor R 14 and light emitting diode D 29 causing D 29 to light thereby indicating a line fault condition. A fault to any clock or group of clocks will cause power shut down to all clocks as described above and thus a time scattering of clocks is prevented.

It will be understood that all of the circuitry, with the exception of the clocks 12*a* through 12*d*, 13*a*, 13*b*, 14, 15, 16*a* and 16*b* and the wires external 240, 241, 300 and 301 leading to such clocks, are within a single centrally located control box (not shown). If any of the wires 240, 241, 300 or 301 are hooked up improperly, the light emitting diode D 29 will be lighted to give a logic B 32 indication.

SYNCHRONIZER

Interface

In order to interface the synchronizer according to the subject invention with the master time controller system previously described, a multiple pin dual-in-line connector (DIP) is provided. Accordingly then, hereinafter when referring to a specific pin of the connector, the letters DIP shall precede the pin number.

Referring now to FIGS. 2A and 2B, connecter pins DIP 6 and DIP 7 are connected across the battery 20 by means of the wires 23*a* and 22*a* respectively, so as to provide an uncontrolled +24 vdc to the synchronizer circuitry to be described. Connector pin DIP 5 is connected to the junction of resistor R10, the cathode of zener diode Q4 and normally opened K3 relay contacts Sw3-1 by means of the wire 31*a*. This junction is the originating point of the +24 vdc supply potential which is controlled by the system on/off switch S2. Switch S2 is adapted to activate relay K3 when closed. Thus DIP 5 provides the synchronizer with +24 vdc which is applied in accordance with the operation of the system's on/off switch S2. Connector pin DIP 4 is connected via wire 206*a* to the cathode of zener diode D 11 which is adapted to provide a regulated +10 vdc supply potential for the integrated circuits to be described which are utilized in both the system and the synchronizer. This +10 vdc appearing at DIP 4 is also controlled by the system on/off switch S2 shown in FIG. 2A.

Connector pin DIP 1 is connected by means of wire 236*a* to the junction of resistor R 22, Z 2 pin 5, Z 18 and pin 8 and the normally closed relay contact Sw 2-2 of relay K 2 shown in FIG. 2B. The relay K 2 is operated only when the system is manually set to an advanced or retarded mode of operation. Unless relay K2 is operated, the +10 vdc from the cathode of zener diode D 11 appearing on wire 206 is fed through the normally closed contact Sw 2-2 to connector pin DIP 1. DIP 1 provides a signal hereinafter referred to as the CHANGE INHIBIT signal from the system which if it is high, i.e. +10 volts, enables the synchronizer to initiate an advance or retard mode command to the system if a time correction is required. If the system is already manually set into an advanced or retarded mode, the relay K 2 will be operated and the +10 vdc appearing on wire 206 will no longer be routed to DIP 1. DIP 1 will instead be low, i.e. pulled to ground (0 volts) through resistor R 22. Accordingly, when DIP 1 is low, the synchronizer will be inhibited from initiating an advance or retard mode command to the master time controller system.

As noted earlier, one end of resistor R 38 is connected to the wire 210 and one end of the resistor R 23 is connected to wire 207. Additionally, two jumpers J2 and J3 are adapted to connect wires 210 and 207, respectively, to the cathode of zener diode D 11 when the synchronizer is not in use. When the synchronizer is in use, the jumpers J2 and J3 are removed. It should also be pointed out that when desired, the other jumper J1 previously referred to can be combined with jumpers J2 and J3 in a combined switch arrangement of any appropriate design. The end of resistors R 38 connected to wire 210 is coupled to pin connector DIP 8. When the synchronizer is not commanding a time change and an advance or retard mode is not manually initiated, the synchronizer will force the voltage level at DIP 8 to be high, i.e. +10 vdc. DIP 8 now being +10 volts puts Z 2 pin 6 under the control of signals at the cathodes of diodes D 15 and D 16 shown in FIG. 2A. The cathodes of diodes D 15 and D 16 now both switch high for 1/32 of a second once each ⅛ of a second due to the binary counting action of counter Z 9. When the cathodes of diodes D 15 and D 16 are both high, Z 2 pin 6 will be +10 volts and at all other times at 0 volts. Therefore, Z 8 pin 10 which inverts the signal at Z 2 pin 4 will switch high (+10 v) for 1/32 of a second once each ⅛ of a second and will be low (0 volts) at all other times. If Z 10 pin 2 is high, then the 32 Hz. pulses appearing at pin 15 of counter Z 9 connected to Z 10 pin 1 will be gated to Z 8 pin 13 and when Z 8 pin 10 is zero, the 32 Hz. signal will gate through Z 8 pin 3 (FIG. 2B). Since Z 8 pin 10 is only low ¾ of the time, only 24 pulses of the 32 Hz. signal will be gated to Z 8 pin 3. Therefore, the signal at Z 8 pin 3 is 24 Hz. If and only if Z 8 pin 6 is low, the 24 Hz. pulse at Z 8 pin 3 will be gated through Z 8 pin 4 to produce normal 24 Hz. timing pulses which after routing through other gating and buffering circuitry of the system are used to drive the system time keeping and recording clocks. These same timing pulses are connected back to the synchronizer via connector pin DIP 3 whereupon they will be counted in successive one minute time frames derived from the WWV signal broadcast by the National Bureau of Standards as will be hereinafter described.

Connector pin DIP 10 which is adapted to apply a signal to the system referred to as a synchronized start or SYNC START signal, is connected to wire 222*a* which connects to Z 8 pin 6. A jumper J4 as will be shown later on connects DIP 10 to the synchronizer circuitry. Without the jumper, DIP 10 will be open circuited and the synchronizer will have no effect on the system. With the jumper installed, the synchronizer will apply a high signal (+10 volts) to connector pin DIP 10 at the time system power is initially on and will maintain the +10 volts until the first WWV signal is decoded by the synchronizer after power is turned on. After decoding the first WWV signal, the synchronizer will force DIP 10 low. DIP 10 when it is high inhibits the timing pulses from appearing at Z 8 pin 4 and as a consequence, operation of the system time keeping and recording clocks will be inhibited until decoding of the first WWV signal after system power turn on appears. This provides synchronized starting of the master time controller system with WWV.

Connector pin DIP 2 shown in FIG. 2A is connected to the 4 Hz. output signal appearing on wire 215 which, in turn, is connected to pin 3 of counter Z 9. The 4 Hz. signal is used by the decoding circuitry of the synchronizer as will be described to increase the reliability of decoding. Also, as noted earlier, one end of resistor R 23 is coupled to wire 207. Wire 207 in turn connects to connector pin DIP 9. Normally the synchronizer will apply +10 volts to DIP 9 which will have no affect on the system's operation. However, when the synchronizer initiates a RETARD command, a 4 Hz. signal switching between 0 volts and +10 volts respectively will be applied to connector pin DIP 9 and zero volts will be applied to connector pin DIP 8. DIP 8 will pull pin 6 of Z 2 low through resistor R 38 which thereby forces Z 8 pin 10 low also. In turn, this enables the pulses at NAND gate Z 10 pin 3 to gate through to Z 8 pin 4 to produce system timing pulses. The 32 Hz. pulses at Z 10 pin 1 are gated to Z 10 pin 3 only when Z 10 pin 2 is high. Z 10 pin 2 is controlled by the signal at connector pin DIP 9 through resistor R 23 which is high for only ⅛ of a second each ¼ of a second. Therefore, only 16 pulses of the 32 Hz. at Z 10 pin 1 will be gated to Z 10 pin 3 each second. As a result the timing pulse rate at Z 8 pin 4 will be 16 Hz. Finally, as noted above, a jumper J1 shown in FIG. 2A is adapted to connect pin 2 of NAND gate G1 to ground. This simulates a failure of the utility line power and causes the system to use the crystal oscillator U 2 as the time base when the synchronizer is in operation.

Block Diagram

Figure 6:
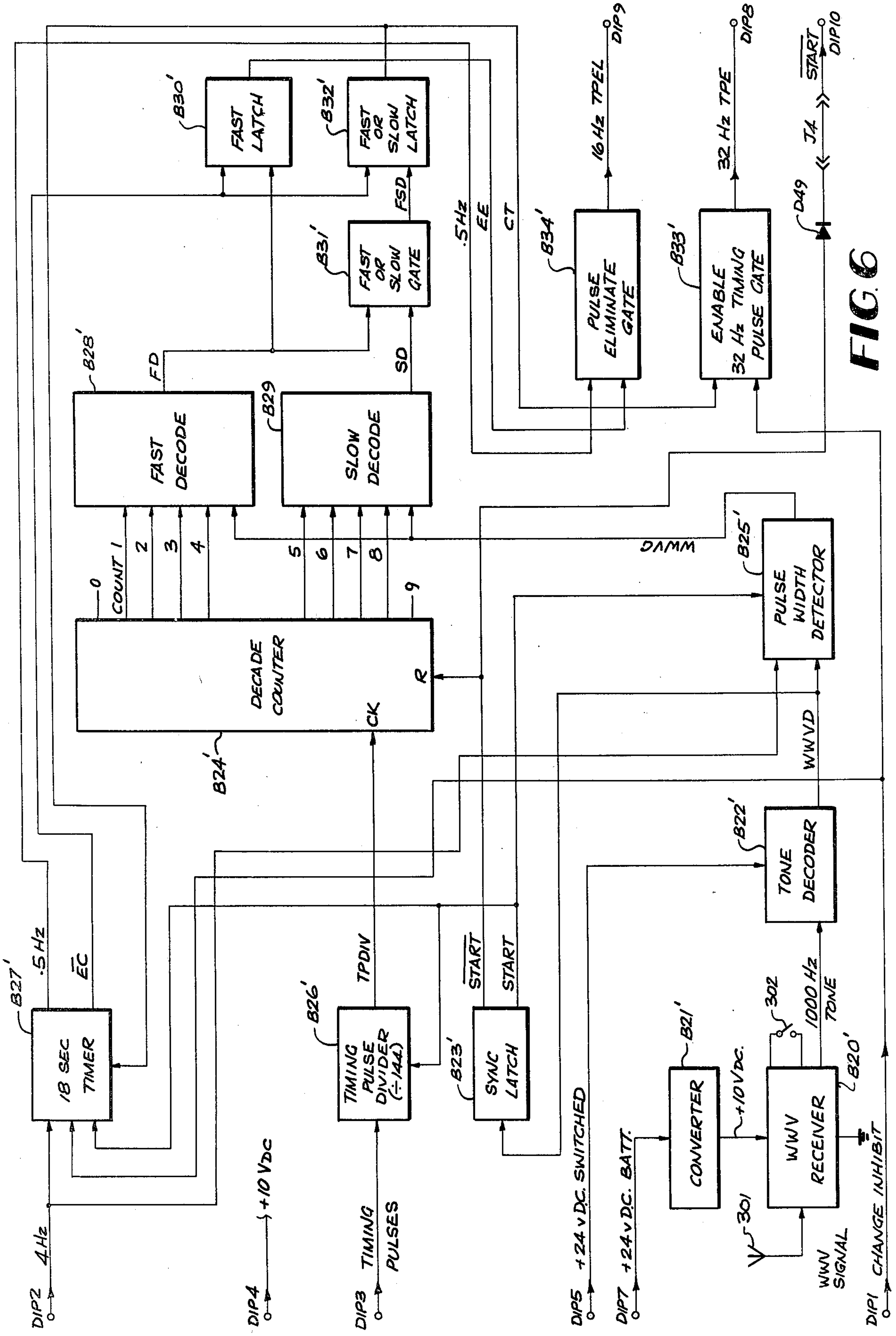
FIG. 6 is an electrical block diagram illustrative of the preferred embodiment of the synchronizer according to the present invention.

The synchronizer according to the subject invention is shown in block diagrammatic form in FIG. 6. It is comprised of fifteen functional blocks or sub-circuits B20′ through B 34′. Reference numeral B 20′, for example, denotes a radio receiver which is adapted to receive and be responsive to the WWV signal broadcast by the National Bureau of Standards. The receiver B 20′ accordingly outputs a 1000 Hz. tone for 0.8 seconds once each minute in order to provide a highly accurate repetitive time interval. A +10 vdc supply potential is supplied to the WWV receiver B 20′ by means of a voltage converter B 21′ which steps down the +24 vdc battery supply potential supplied by the battery 20 shown in FIG. 2A and coupled thereto by means of a connector pin DIP 7. The receiver B 20′ also includes a speaker not shown, which enables the user to hear the WWV time broadcasted. A mute switch 302 is also included in the receiver B 20′ to enable the user to turn off the speaker when desired.

The 1000 Hz. tone out of the receiver B 20′ is fed to a tone decoder circuit B 22′ which is adapted to be sensitive only to 1000 Hz. signals and as a consequence during each 1000 Hz. tone from the receiver B 20′, will generate a +10 volt (high) output signal defined as the WWVD signal. During the absence of a 1000 Hz. tone, the WWVD signal is at 0 volts (low). Power for the tone decoder circuit B 22′ is provided by the switch controlled +24 vdc applied to connector pin DIP 5 shown in FIG. 2A. With the exception of the WWV receiver B 20′ and the tone decoder circuit B 22′, all power to the synchronizer is provided by the +10 vdc supply potential provided by the system at the cathode of zener diode D 11 shown in FIG. 2A and which is coupled to connector pin DIP 4. This supply potential is also controlled by the system on/off switch S 2, which is adapted to operate relay K 3. Next, a sync latch circuit B 23′ is included which operates when power is initially turned on to generate two signals identified as START and $\overline{\text{START}}$ which are set at 0 volts and +10 volts, respectively. $\overline{\text{START}}$ being high is coupled to a reset terminal R of a decade counter B 24′ and to wire 222*a* of FIG. 2B through a diode D 49, jumper J4 and DIP 10. The START signal on the other hand is coupled to a pulsewidth detector circuit B 25′, a timing pulse divider circuit B 26′, and an eighteeen second timer circuit B 27′. The START signal being 0 volts is adapted to reset the timing pulse divider B 26′ and inhibit operation of the pulsewidth detector B 25′ and the eighteen second timer B 27′.

The first 1000 Hz. tone received by the receiver B 20′ after power is turned on will cause the WWVD signal from the tone decoder B 22′ to trigger the sync latch circuit B 23′ such that the START signal will go high while the $\overline{\text{START}}$ signal will go low. The $\overline{\text{START}}$ signal now being low enables the decade counter B 24′. The START signal being high enables the timing pulse divider B 26′, the pulsewidth detector B 25′, and the eighteen second timer B 27′, the latter providing an inhibit signal $\overline{\text{EC}}$ which translates to "not enable change". System timing pulses applied to the synchronizer via pin connector DIP 3 which connects back to Z 8 pin 4 shown in FIG. 2B is fed to the timing pulse divider B 26′ which acts to divide the input timing pulses by a factor (÷144) to produce a digital signal TPDIV which under normal system operation provides a pulse rate of one pulse each six seconds. The TPDIV signal feeds into the clock input of the decade counter B 24′, which steps or advances one count for each TPDIV pulse applied thereto. Therefore, the decade counter B 24′ will remain at each count level for six seconds during normal operation. The amount of time the counter B 24′ spends at each count level is directly proportional to the system timing pulse rate as defined by the following expression:

$$\text{Count time} = (6/4) \times (\text{timing pulse rate}) \quad (1)$$

The counter B 24′ repeatedly counts from 0 to 9 and during normal 24 Hz. system operation, requires one minute to step 10 counts. The decade counter B 24′ is held reset to count 0 at initial power turn on, but starts counting when the first 1000 Hz. tone is received. Therefore, the decade counter B 24′ should count from 0 through 9 and just be stepping back to count 0 each time a 1000 Hz. tone is received since the WWV tone is transmitted at precise one minute intervals. If the master time controller system timing pulse rate is fast, however, the counter B 24′ will eventually creep into count 1 when a subsequent 1000 Hz. tone is received and unless the system timing pulse rate is increased, the decade counter B 24′ will continue to creep into counts 2, 3 or 4, as still subsequent 1000 Hz. tones occur. Similarly, if the system timing pulse rate is slow, the decade counter B 24′ will move back to count 9 when a subsequent 1000 Hz. tone occurs and will continue to creep back into counts 8, 7, 6 and 5, as time progresses.

The count outputs 1, 2, 3 and 4 are fed to the inputs of a fast decode circuit B 28′ while the count outputs 5, 6, 7 and 8 route to the inputs of a slow decoder circuit B 29′. A WWVG signal generated by the pulsewidth detector circuit B 25′ also connects to respective inputs of the fast and slow decoders B 28′ and B 29′. The WWVG signal is normally low, but goes high when the WWVD signal from the tone decoder B 22′ goes high for at least 250 milliseconds when the tone decoder senses 1000 Hz. The pulse detector circuit B 25′ thus verifies that a WWV signal is received, since the WWV tone broadcast by the National Bureau of Standards lasts for 0.8 seconds. Therefore, if the WWVD signal lasts for at least 250 milliseconds, the WWVG signal will occur 0.25 seconds following the beginning of the 0.8 second WWV tone received.

The WWVG signal will go low when the WWVD signal goes low. Therefore, the WWVG signal from the pulsewidth detector B 25′ is a positive digital representation of the WWV 1000 Hz. tone. If the decade counter B 24′ is at a count 1, 2, 3 or 4 when WWVG signal goes high, the output signal FD of the fast decoder B 28′ will also go high, i.e. to +10 volts. The high FD signal will latch a fast latch circuit B 30′ and cause the fast or slow gate circuit B 31′ to set a fast or slow latch circuit B 32′. Setting the fast latch circuit B 30′ causes its output signal EE signifying "eliminate enable" to go from 0 volts to +10 volts. Setting the fast or slow latch circuit B 32′ causes its output signal CT indicating "change time" to go from 0 volts to +10 volts. The CT signal is simultaneously fed to the eighteen second timer B 27′ and an enable 32 Hz. timing pulse gate B 33′. The CT signal starts the eighteen second timer circuit B 27′, which outputs a 0.5 Hz. signal and additionally forces the gate B 33′ to output a signal identified as 32 Hz. TPE, which is fed to connector pin DIP 8, which in turn feeds back to R 38 by means of wire 210 shown in FIG. 2A.

The output of the fast latch circuit B 30′ couples to a pulse eliminate gate B 34′. When high, the signal EE enables the pulse eliminator gate B 34′ to pass the 0.5 Hz. signal from the eighteen second timer circuit B 27′ to produce an output signal identified as 16 Hz. TPEL which is fed to DIP 9 which in turn connects back to resistor R 23 by means of wire 207 as shown in FIG. 2A. The 16 Hz. TPEL signal which is normally high, i.e. +10 volts, is then caused to switch between 0 volts and +10 volts at a 0.5 Hz. rate. The 32 Hz. TPE signal being high sets the system timing pulse rate to 32 Hz., whereupon the 16 Hz. TPEL signal eliminates system timing pulses during its low or 0 volt time. By this operation, the effective system timing pulse rate is caused to be 16 Hz. This pulse rate in addition to slowing down the system clocks one second each three seconds, increases the time required for the TPDIV pulse to be outputted from the timing pulse divider circuit B 26′.

Accordingly, after eighteen seconds, the signal $\overline{EC}$ from the eighteen second timer circuit B 27' will go to high and reset the fast latch circuit B 30' as well as the fast or slow latch circuit B 32', which in turn stops the eighteen second timer B 27' and returns the system timing pulse rate to 24 Hz. and the decade counter B 24' will have moved back one count towards count zero. The above action is repeated each time a WWVG pulse appears until the decade counter Z 24 is no longer at a count 1, 2, 3 or 4, when WWVG goes high.

If on the other hand the decade counter B 24' is at a count 8, 7, 6 or 5, when WWVG goes high, the slow decode circuit B 29' will cause its output SD to go high, indicating a slow condition. A high (+10 volt) SD signal will cause the fast or slow gate circuit B 31' to set the fast or slow latch B 32'. The fast or slow latch B 32' being set, forces its output signal CT to go high also. CT being high starts the eighteen second timer circuit B 27' and additionally forces the 32 Hz. TPE output high. With this signal at +10 volts, the system timing pulse rate will cause the system timing pulse rate to be 32 Hz. The system timing pulse rate now being 32 Hz. will cause the system clocks to gain one second each three seconds and will decrease the time required for a TPDIV pulse from the timing pulse divider B 26'. After eighteen seconds, the signal $\overline{EC}$ from the timer circuit B 27' will go to high, and reset the fast or slow lach B 32' which in turn stops the eighteen second timer B 27' and return the system timing pulses to its normal 24 Hz. rate. Following this action, the system clocks will have gained six seconds and the decade counter will have advanced one count towards zero when the WWVG goes high. The above operation is repeated until the decade counter B 24' no longer provides counts of 8, 7, 6 or 5 when WWVG goes high.

Accordingly, the synchronizer is adapted to provide a six second time correction each minute, provided that a manual update mode of the system has not been initiated, meaning that under normal operation, connector pin DIP 1 will be high, i.e. at +10 volts. However, should a manual update be initiated, relay K 2 shown in FIG. 2B will be energized, causing switch contacts Sw 2-2 to open, whereupon the voltage at DIP 1 will go low, causing the gate Z 33 to be inhibited from further operation until the manual update mode has terminated.

Circuit Diagram

Having thus described in detail the block diagram shown in FIG. 6, reference now will be made to FIGS. 7A and 7B, which disclose in detail the circuit components utilized in configuring the sub-circuits B 21' through B 34'.

First, considering the +24 volt to +10 volt converter B 21', it is comprised of transistor Q 50, zener diode D 50, resistor R 100 and capacitor C 100. The +24 volt dc battery potential applied from connector pin DIP 7 via wire 275 is continuously applied to the collector of transistor Q 50 and resistor R 100 whereupon resistor R 100 provides base current to transistor Q 50 turning it on. The base voltage and thus the emitter voltage of transistor Q 50 is limited by the zener voltage level of diode D 50 which is a +10 volt zener diode. The emitter of transistor Q 50 thereby provides +10 volt power to the WW receiver D 50 by wire 276.

Referring now to the tone decoder circuitry B 22', it is comprised of capacitors C101 through C115, resistors R101 through R120, diodes D51 through D53, light emitting diode D54, transistor Q51, potentiometer R121, field effect transistor Q52 and dual operational amplifier A20/A and A20/B. The decoder circuitry B22' is powered from the +24 volt dc supply potential applied from wire 277 coupled to connector pin DIP 5 and which is controlled by the system on/off switch 2 shown in FIG. 2A. Capacitors C116 and C113 together with resistor R120 provide filtering of the +24 volt dc power input. Resistors 101 through R108, capacitors C101 through C105 and C114 and operational amplifier A20/A form a 1000 Hz. low pass filter. The 1000 Hz. tone from the WWV receiver B20' inputs to this filter at the junction of resistor R101 and capacitor C101 by means of wire 278. The output of the low pass filter at A20/A couples to the input of a 1000 Hz. band pass filter. The band pass filter having approximate Q of 50 is comprised of capacitors C106 through C112, resistors R109 through R116, diodes D51 and D52, potentiometer R121, field effect transistor Q52 and operational amplifier A20/B. Adjustment of the potentiometer R121 provides adjustment of the band pass frequency.

The field effect transistor Q52 functions as a voltage variable resistor increasing in resistance as the voltage at the junction of resistor R114 and capacitor 111 increases. The closer the input signal frequency at capacitor 106 is to 1000 Hz., the larger the output will be from A20/B. The output of amplifier A20/B is coupled through capacitor C110 and rectified by diodes D51 and D52 to a negative DC potential. This DC voltage is further smoothed by capacitor C111. As the DC voltage increases negatively, the resistance of transistor 52 increases and thereby causes the output of A20/B to increase even further. The net effect of the circuit is that the voltage at the junction of capacitor C111 and resistor 114 will rapidly increase from a small negative DC voltage to approximately −5 vdc as the input signal on wire 278 approaches 1000 Hz. This voltage level is sensed by the circuit composed of resistors R117 through R119, light emitting diode D54, diode 53 and transistor Q51. If the DC voltage is less than −3.5 volts, transistor Q51 will be turned on and its collector will be at 0 volts. Additionally, diode 54 will be illuminated, indicating that the WWV 1000 Hz. tone is not present. If the DC voltage is more negative than −3.5 volts, then transistor 51 will be turned off, causing its collector to be at +10 volts. As a result of this, light emitting diode D54 will not be illuminated indicating that the WWV 1000 Hz. tone is present. The collector of transistor Q51 produces the WWVD signal which feeds to the sync latch circuit B23' and the pulse width detector B25'.

Referring now to the sync latch circuit B23', it consists of capacitor 120, resistor R125, and a D type latch circuit Z 50. Z 50 is allowed to clock only when the reset input, pin 4, is less than +5 volts. On the other hand, the latch Z 50 is reset and held reset if pin 4 is greater than 5 volts. Wire 279 provides the +10 volt supply potential applied from pin connector DIP 4. This voltage is applied to capacitor C120 which begins to charge through resistor R125, thereby applying +10 volts to pin 4 and resetting the latch Z 50. Resetting Z 50 forces its START and $\overline{START}$ outputs appearing at pins 1 and 2 respectively and applied to wires 280 and 281, to zero volts and +10 volts respectively. After capacitor C120 has charged to +5 volts, the latch Z 50 is enabled to be clocked by a WWVD signal applied to pin 3. Whenever the signal WWVD goes to +10 volts, the START and $\overline{START}$ signals switch to +10 volts and 0 volts, respectively. This condition will be maintained until power is turned off.

Considering now the pulse width detector circuit B 25', it consists of a two input NAND gate G 50 and a pair of integrated circuit D-type flip-flops Z 51 and Z 52. At initial power turnon, the START signal on wire 280 from the sync latch circuit B 23' will be zero volts, forcing pin 4 of gate G 50 to +10 volts. This in turn resets and holds pin 2 of flip-flop Z 51 and pin 12 of Z 52 at +10 volts. After the START signal goes high, the output (pin 4) of NAND gate G 50 will go low each time WWVD goes high, enabling flip-flops Z 51 and Z52 to clock. The clock input at pin 3 of flip-flop Z 51 is fed by the four Hz. signals from the system applied via connector pin DIP 2 and wire 282, which decouples back to pin 3 of divider circuit Z 9 shown in FIG. 2A. This signal will cause pin 2 of flip-flop Z 51 to switch between zero volts and +10 volts at a 2 Hz. rate. The first time Z 51 pin 2 goes from zero volts to +10 volts, a minimum of 250 milliseconds, pin 12 of flip-flop Z 52 will be clocked to zero volts and will remain at zero volts until the output of NAND gate G50 goes high and resets flip-flops Z 51 and Z 52. The output of NAND gate G50 will again go high when WWVG goes to zero volts. The output of the pulse width detector B25' which appears at pin 12 of flip-flop Z 52 has been noted to be the WWVG signal which is fed via wire 283 to the fast and slow decoder circuits B28' and B29' (FIG. 7A).

Referring now to the timing pulse divider circuit B26', this circuit consists of a fourteen stage binary ripple counter Z 53 and three NAND gates G51, G52 and G53. Initially at power turnon, the output (pin 10) of NAND gate 51 is held high at +10 volts by the zero level of the START signal from the sync latch B23'. Pin 10 of gate 51 being coupled to pin 11 of Z 53, holds the counter reset terminal R to zero count. After the START signal on wire 280 goes high, the output of gate G 51 will go to zero volts and enable counter Z 53 to be clocked by the timing pulse from the system, which are coupled thereto by means of connector pin DIP 3 and wire 284. NAND gate G52 having a normal output of +10 volts appearing at pin 1 decodes the count level of Z 53 and outputs zero volts at pin 1 when Z 53 is clocked to count 144. This causes NAND gate G51, pin 10 to output +10 volts and reset the counter to zero. Thus counter Z 53 repeatedly counts from 0 through 144. NAND gate G 53 which normally outputs +10 volts is adapted to decode each 144th count of the counter Z 53. Thus for example, when the count output of Z 53 is between 128 and 144, the output of NAND gate G 53 is zero volts. This output called the TPDIV signal switches to zero volts once each 144 timing pulses.

The TPDIV signals appearing on wire 285 are coupled to the decade counter B24' which consists of the decade counter Z 54. Counter Z 54 has ten outputs 0 through 9. The counter is initially reset when the $\overline{\text{START}}$ signal coupled to the reset input R is at +10 volts. When $\overline{\text{START}}$ goes low, i.e. zero volts, Z 54 is adapted to be clocked by the TPDIV signal on wire 285 each time switching from 0 volts to 10 volts occurs. Decade counter Z 54 repeatedly clocks from count 0 through count 9, advancing one count for each TPDIV pulse applied thereto. The ten count outputs are normally low but go high at their respective decimal slot.

Referring now to the fast decoder circuit B28', this circuit is comprised of a four input NOR gate G54 and a two input NOR gate G55. In operation, if any input i.e. count 1, 2, 3 or 4 of Z 54 to gate G54 is high (+10 volts), its output at pin 1 will be low (zero volts). Otherwise, its output will be +10 volts. If pin 1 of G54 is low at the same time the WWVG signal is low, zero volts will be applied to pins 1 and 2 of NOR gate G55 and thus its output signal FD applied to wire 286 will be high (+10 volts). Otherwise, the FD signal will be low. Therefore, if and only if decade counter B24' is at a count 1, 2, 3 or 4 when the 1000 Hz. WWV tone occurs, will the signal FD be +10 volts. Any other condition will cause the FD signal to be low (zero volts).

In a similar manner, the slow decoder circuit B29' is configured from a four input NOR gate G56 and a two input NOR gate G57. If any input to NOR gate 56 is high, then its output will be low. Otherwise, pin 13 of gate G56 will be at +10 volts. Now if both pin 13 of NOR gate G56 is low and the WWVG signal is low, then the NOR gate G57 output signal SD appearing at pin 4 and coupled to wire 287 will be high. Otherwise, the SD signal will be low. Therefore, if and only if the decade counter B24' provides a count output of 5, 6, 7 or 8 when the WWV 1000 Hz. tone occurs, the SD output of NOR gate G57 will be high (+10 volts).

As noted earlier, both the FD signal from the fast decoder circuit D28' and the SD signal outputted from the slow decoder B29' are applied to the fast or slow gate B31'. This circuit consists of a two input NOR gate G58 coupled to the NOR gate G59. The NOR gate G59 is used to invert the output of NOR gate G58 and thus the output signal FSD appearing at pin 11 is high if either input to NOR gate G58 is high. Therefore, if and only if the decade counter is at a count other than zero when the WWV 1000 Hz. tone occurs will the FSD signal applied to wire 288 be high (+10 volts).

The FSD signal outputted from the fast or slow gate B31' is utilized to set the fast or slow latch circuit B32' consisting of a D-type integrated circuit latch Z 55. The $\overline{\text{EC}}$ signal is applied via wire 289 to the reset input (pin 4) from the eighteen second timer circuit B27'. When $\overline{\text{EC}}$ is high or momentarily pulses high, the output signal CT appearing at pin 2 and coupled to wire 290 will be latched at +10 volts. If on the other hand $\overline{\text{EC}}$ is low and FSD is high or momentarily pulsed to +10 volts, then the CT signal will latch at zero volts, a condition which puts the master controller system in a retarded or advanced mode.

Another D-type latch Z 56 is utilized to configure the fast latch circuit B30'. Latch Z 56 has a set and a reset input at pins 8 and 10 respectively, and produces the pulse eliminate enable signal EE at pin 12 which is then applied to wire 291. The reset of latch Z 56 is controlled by the signal $\overline{\text{EC}}$ applied from the eighteen second timer B27' via wire 289 while the set input is controlled by the signal FD from the fast decode circuit B28' via wire 286. In operation, when the signal $\overline{\text{EC}}$ is high or momentarily high, the output signal EE on wire 291 from the latch Z 56 will latch to +10 volts, i.e. high. If $\overline{\text{EC}}$ is low and signal FD is high or momentarily pulsed high, then the EE signal will latch low, a condition which is adapted to put the master time controller system in a retarded mode of operation.

The two latches B30' and B32' feed into the pulse eliminate gate B34' and an enable 32 Hz. timing pulse gate B33', respectively. The latter gate circuit B33' is composed of two NAND gates G60 and G61 and operate such that if both inputs to gate G60 which comprises the system CHANGE INHIBIT signal coupled from connector pin DIP 1 by way of wire 292 and the CT output signal on wire 290 from the latch B32′ are high, then the output signal on wire 293 appearing at pin 10 of the NAND gate G61 which is identified as the 32 Hz.TPE will be high, i.e. +10 volts. Any other condition of the change inhibit and CT signals will cause the 32 Hz.TPE signal to be zero volts, a condition necessary for the advance mode of operation. The pulse eliminate gate B34′ consists of a pair of NOR gates G62 and G63, the latter of which is used to invert the output of G62. The two inputs of NOR gate G62 are coupled to the output EE (wire 291) from the fast latch circuit B30′ and the 0.5 Hz. output appearing on wire 294 from the eighteen second timer B27′. If signal EE is high (+10 volts) the output signal 16 Hz.TPEL appearing at pin 10 of gate G63 and fed to wire 295 will be low (zero volts). If the signal EE on the other hand is low (zero volts) the 16 Hz.TPEL signal will switch at a 0.5 Hz. rate, being zero volts when 0.5 Hz. is +10 volts and +10 volts when 0.5 Hz. signal is zero volts.

Figure 7A:
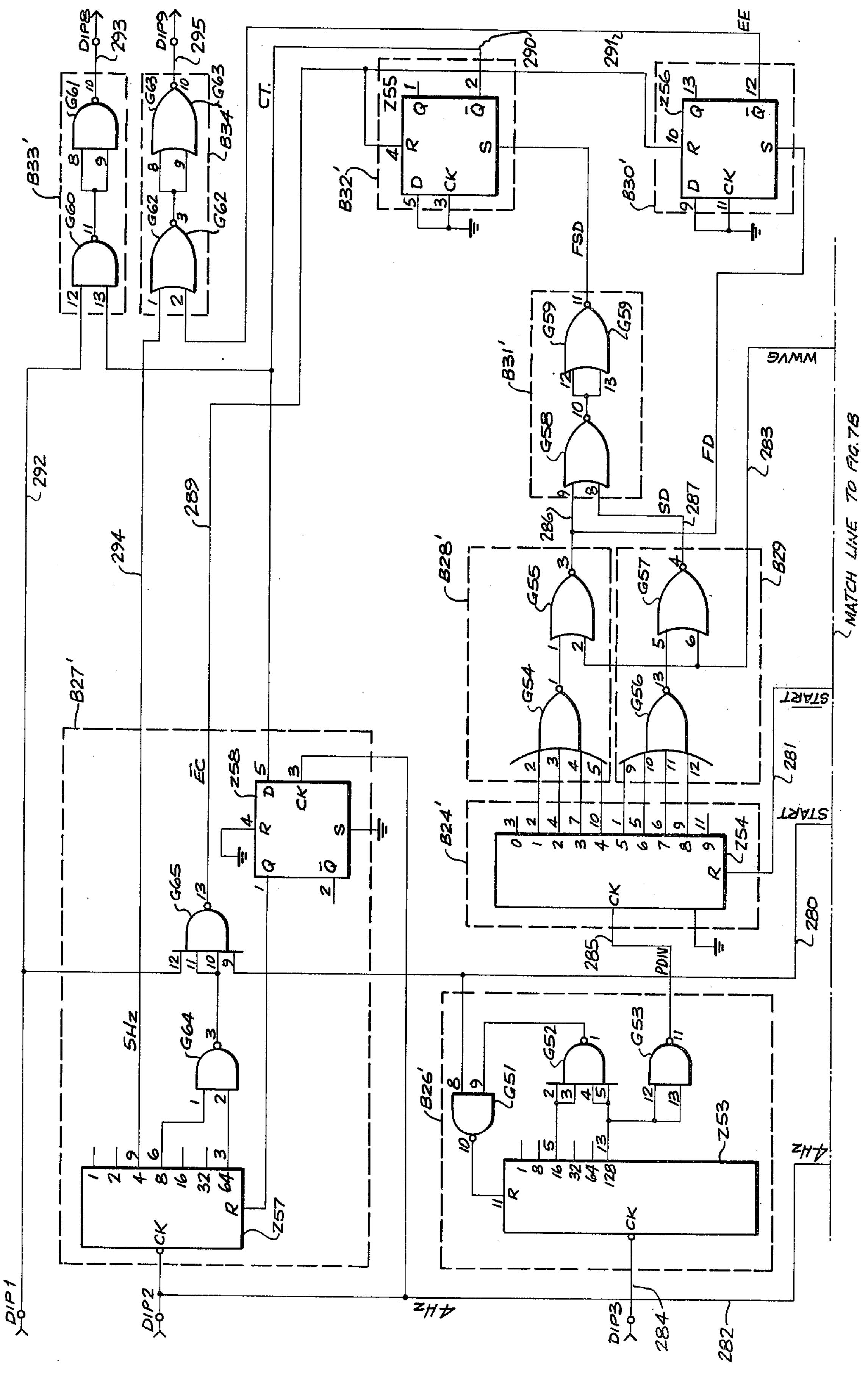
FIGS. 7A and 7B disclose a detailed electrical schematic wiring diagram of the block diagram shown in FIG. 6.
Figure 7B:
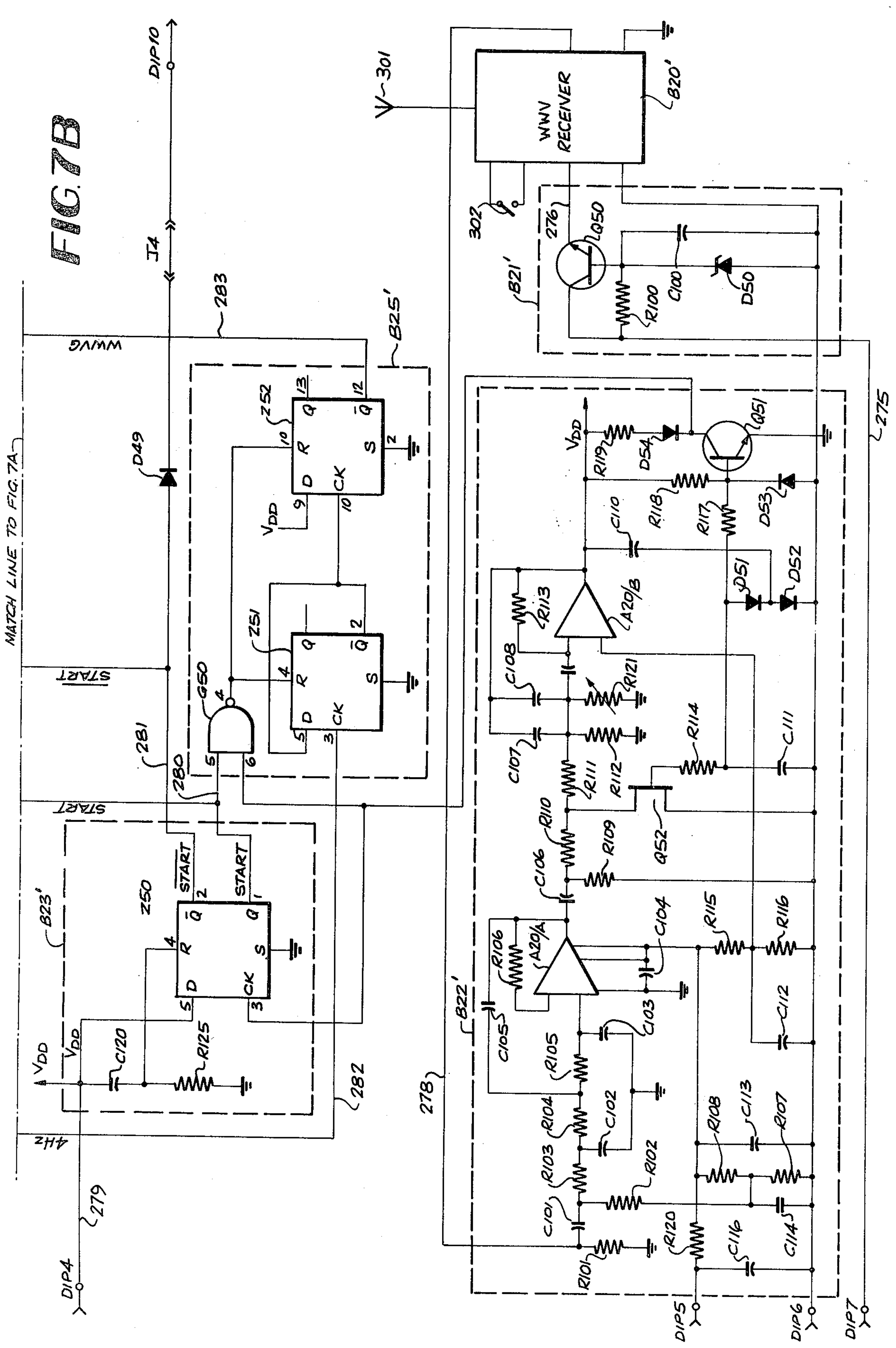

Finally, the eighteen second timer circuit B27′ is shown in FIG. 7A consisting of a seven stage binary counter Z 57, a pair of NAND gates G64 and G65 and a D-type flip-flop Z 58. The flip-flop Z 58 is clocked by the leading edge of the 4 Hz. signal applied from the master controller system via pin connector DIP 2 applied to pin 3 thereof by means of wire 295. The counter Z 57 is clocked by the trailing edge of the same 4 Hz. signal. The binary high or low level of the output signal CT from the fast or slow latch circuit B32′ is clocked from the D input (pin 5) of flip-flop 58 to the Q output (pin 1) which connects to the reset input of the counter Z 57. If the CT signal appearing on wire 290 is high, the counter Z 57 will be reset to count zero; however, if CT is low, the counter Z 57 will be enabled to count the 4 Hz. clock pulses. When the counter Z 57 reaches count 72, both inputs to NAND gate G64 will be +10 volts, forcing the output pin 3 to be zero volts. With regard to the second NAND gate G65, a low binary level of the change inhibit, $\overline{\text{START}}$ or the output of NAND gate G64 forces the $\overline{\text{EC}}$ signal appearing at pin 13 of gate G65 to +10 volts, a condition which resets both the fast latch B30′ and the fast or slow latch B32′.

Thus what has been shown and described is a combination of capacitors, diodes, resistors, logic gates, latches and counters forming a synchronizer which is designed to operate in conjunction with the above cross-referenced master time controller system to provide a means of linking the time keeping accuracy of the time controller system as set forth both in the referenced application and herein to a highly stable and accurate time standard provided by the WWV signal broadcast by the National Bureau of Standards.

Having thus shown and described what is at present considered to be the preferred embodiment of the subject invention,

What is claimed is:

1. In a time controller system of the type which supplies electrical timing pulses of a predetermined pulse rate derived from a frequency source to one or a plurality of clocks for driving the respective clock mechanisms included therein in response to the number of timing pulses received and wherein said system includes means for increasing or decreasing the timing pulse rate relative to said predetermined pulse rate for advancing or retarding the time indication of said clocks, the improvement comprising:

synchronizer circuit means coupled to said system for automatically controlling said means for increasing or decreasing the timing pulse rate following at least one timing pulse measurement period, which period is derived from signals received from a predetermined standard signal source;

radio receiver means coupled to said synchronizer circuit means and being operatively responsive to a WWV signal broadcast by the National Bureau of Standards, said receiver means providing a tone output signal at one minute intervals and wherein said synchronizer circuit means is responsive to said tone output signal and includes circuit means for generating digital signals for defining said pulse measurement period in response to said tone output signals;

said synchronizer circuit means additionally includes means for inhibiting operation of said one or a plurality of clocks until the occurrence of the first said WWV signal following power being applied to the system.

2. In a time controller system of the type which supplies electrical timing pulses of a predetermined pulse rate derived from a frequency source to one or a plurality of clocks for driving the respective clock mechanisms included therein in response to the number of timing pulses received and wherein said system includes means for increasing or decreasing the timing pulse rate relative to said predetermined pulse rate for advancing or retarding the time indication of said clocks, the improvement comprising:

synchronizer circuit means coupled to said system for automatically controlling said means for increasing or decreasing the timing pulse rate following at least one timing pulse measurement period, which period is derived from signals received from a predetermined standard signal souce;

radio receiver means coupled to said synchronizer circuit means and being operatively responsive to a WWV signal broadcast by the National Bureau of Standards, said receiver means providing a tone output signal at one minute intervals and wherein said synchronizer circuit means is responsive to said tone output signal and includes circuit means for generating digital signals for defining said pulse measurement period in response to said tone output signals;

said synchronizer circuit means additionally includes discriminator means for discriminating against false tone signals, said discriminator means providing a signal for rendering operative said synchronizer circuit means after a minimum duration of time upon the occurrence of said tone output signal.

3. The system as defined by claim 2 wherein said WWV signal comprises a 1000 Hz. tone burst and said tone output signal comprises a 1000 Hz. tone.

4. In a time controller system of the type which supplies electrical timing pulses of a predetermined pulse rate derived from a frequency source to one or a plurality of clocks for driving the respective clock mechanisms included therein in response to the number of timing pulses received and wherein said system includes means for increasing or decreasing the timing pulse rate relative to said predetermined pulse rate for advancing or retarding the time indication of said clocks, the improvement comprising:

synchronizer circuit means coupled to said system for automatically controlling said means for increasing or decreasing the timing pulse rate following at least one timing pulse measurement period, which period is derived from signals received from a predetermined standard signal source;

circuit means for receiving periodic signals from said standard signal source and providing periodic output signals in accordance therewith; and wherein said synchronizer circuit means comprises:

timing pulse counter circuit means coupled to said system timing pulses and providing a count output signal therefrom;

digital circuit means coupled to said receiving circuit means and being adapted to generate a digital pulse coincident with each of said periodic output signals from said receiving circuit means;

decoder circuit means coupled to said counter circuit means and said digital circuit means and being responsive to said digital pulse to decode the count level of said counter circuit means and provide a first control signal for a first count level range and a second control signal for a second count level range;

timer circuit means coupled to said decoder circuit means and being triggered thereby to provide a time control signal which is fed back to said decoder circuit means to inhibit further operation of said decoder circuit means until a subsequent digital pulse from said digital circuit means is generated;

retard circuit means coupled to said decoder circuit means and being responsive to said first control signal to produce a signal coupled back to said means for increasing or decreasing the timing pulse rate and being operative to effect a decrease of the timing pulse rate; and advance circuit means coupled to said decoder circuit means and being responsive to said second control signal to provide a signal coupled to said means for increasing or decreasing the timing pulse rate and being operative to effect and increase of the timing pulse rate.

5. The system as defined by claim 4 wherein said synchronizer circuit means additionally includes:

time correction inhibit circuit means for inhibiting operation of both said retard circuit means and said advance circuit means in the event said means for increasing or decreasing the timing pulse rate has been manually set into operation.

6. The system as defined by claim 4 wherein said frequency source comprises a crystal oscillator circuit.

7. The system as defined by claim 4 wherein said circuit means for receiving signals from said standard signal source comprises radio receiver means operable to receive WWV broadcast by the National Bureau of Standards and being responsive to the 1000 Hz. tone signal of 0.8 seconds duration broadcast at precise one minute intervals and wherein said periodic output signals therefrom comprises 1000 Hz. tone signals.

8. The system as defined by claim 7 wherein said digital circuit means comprises a tone decoder circuit coupled to said receiver means and being responsive to said 1000 Hz. tone output signals each minute to provide a signal of a first binary digital value during occurrence of said tone signals and of a second binary digital value during the absence of said tone signals.

9. The system as defined by claim 8 wherein said digital circuit means additionally includes a pulsewidth detector circuit coupled to said tone decoder circuit and being operable to provide a digital control pulse to said decoder circuit means in the event that said signal of said first digital binary value is of a predetermined pulse width.

10. The system as defined by claim 9 wherein said digital circuit means additionally includes circuit means defined as a sync latch circuit coupled to said tone decoder circuit for resetting said timing pulse counter circuit and enabling said means for increasing or decreasing the timing pulse rate upon the occurrence of the first 1000 Hz. tone signal following system turn-on.

11. The system as defined by claim 4 wherein said timing pulse counter circuit means comprises a digital counter circuit and additionally including a timing pulse divider circuit coupled to said timing pulses and being operative to divide the timing pulse rate by a predetermined factor to provide a reduced number of timing pulses to said counter circuit.

12. The system as defined by claim 11 wherein said ring counter comprises a decade counter.

13. The system as defined by claim 12 wherein said decoder circuit means includes first circuit means coupled to count outputs 1 through 4 of said decade counter to provide a first intermediate control signal and second circuit means coupled to count outputs 5 through 8 of said decade counter to provide a second intermediate control signal;

a first latch circuit coupled to said first intermediate control signal and a timing signal from said timer circuit means and being operable to generate said first control signal coupled to said retard circuit means;

a second latch circuit coupled to both said first and second intermediate control signal and said timing circuit means for generating said second control signal coupled to said advance circuit means.

14. The system as defined by claim 13 and additionally including a gate circuit coupling said first and second intermediate control signals to said second latch circuit.

15. The system as defined by claim 14 wherein said retard circuit means comprises a digital gate circuit adapted to couple a digital circuit to said means for increasing or decreasing the timing pulse rate for effecting elimination of a predetermined number of timing pulses during the operation period of said timer circuit means.

16. The system as defined by claim 14 wherein said advance circuit means comprises a digital gate circuit for providing a digital signal to said means for increasing or decreasing the timing pulse rate to increase the number of timing pulses applied during the operation period of said timing circuit means.

17. A method of synchronizing time keeping accuracy of a master time controller system to a standard time signal wherein the time controller system drives one or more clocks by means of electrical timing pulses applied thereto from a source comprising the steps of:

sensing the time interval between said standard time signals;

counting the number of said electrical timing pulses during said interval; and thereafter eliminating a predetermined number of timing pulses for a subsequent second time interval less than said predetermined time interval in the event a first count level is counted and increasing the number of electrical timing pulses for said second time interval in the event a second count level is counted.

18. The method as defined by claim 17 wherein said step of sensing said standard time signal comprises sensing the WWV signal broadcast by the National Bureau of Standards.

19. The method as defined by claim 18 wherein said step of sensing the WWV signal comprises sensing the 1000 Hz. tone burst broadcast at one minute intervals whereupon said timing pulses are counted for one minute intervals in response to sensing said 1000 Hz. tone burst.

20. The method as defined by claim 19 and additionally including the step of generating at least one digital control signal in response to the first said 1000 Hz. tone burst sensed and applying said control signal to said master time controller system for enabling operation of said system.

21. The method as defined by claim 19 wherein said eliminating and increasing step comprising eliminating or increasing the same number of timing pulses at one minute intervals until a count level other than said first and second count level is reached.

22. The method as defined by claim 19 wherein said counting step comprises sub-dividing the number of said electrical timing pulses by a predetermined factor and feeding the sub-divided pulses into a decade counter for said one minute intervals.

23. The method as defined by claim 22 wherein said counting step additionally includes the step of decoding the count level of said decade counter and generating system control signals for eliminating or adding timing pulses in response to the count level decoded.

24. The method as defined by claim 23 wherein said first count level range comprises the counts 1 through 4 of said decade counter and said second count range comprises count 5 through 8.

* * * * *